US005669979A

United States Patent [19]
Elliott et al.

[11] Patent Number: 5,669,979
[45] Date of Patent: Sep. 23, 1997

[54] PHOTOREACTIVE SURFACE PROCESSING

[75] Inventors: David J. Elliott, Wayland; Richard F. Hollman, Chelmsford; Francis M. Yans, Concord; Daniel K. Singer, Natick, all of Mass.

[73] Assignee: UVTech Systems, Inc., Wayland, Mass.

[21] Appl. No.: 697,018

[22] Filed: Aug. 16, 1996

Related U.S. Application Data

[63] Continuation of Ser. No. 532,992, Sep. 25, 1995, abandoned, which is a continuation of Ser. No. 298,023, Aug. 29, 1994, abandoned, which is a continuation-in-part of Ser. No. 118,806, Sep. 8, 1993, abandoned.

[51] Int. Cl.$^6$ .............................. B08B 3/12; B08B 7/02; B44C 1/22; C03C 15/00
[52] U.S. Cl. .............................. 134/1; 134/1.1; 134/1.2; 134/1.3
[58] Field of Search ........................ 134/1, 1.1, 1.2, 134/1.3; 156/643, 646

[56] References Cited

U.S. PATENT DOCUMENTS

| | | | |
|---|---|---|---|
| 3,118,437 | 1/1964 | Hunt | 126/270 |
| 3,364,087 | 1/1968 | Solomon et al. | 156/4 |
| 3,464,534 | 9/1969 | Muncheryan | 219/12 |

(List continued on next page.)

FOREIGN PATENT DOCUMENTS

| | | |
|---|---|---|
| 0 585 936 A2 | 9/1994 | European Pat. Off. . |
| 58-31528 | 2/1983 | Japan . |
| 60-198437 | 10/1985 | Japan . |
| 62-127655 | 6/1987 | Japan . |
| 63-19809 | 1/1988 | Japan . |
| 1-239837 | 9/1989 | Japan . |
| 5-215692 | 8/1993 | Japan . |
| 5-226790 | 9/1993 | Japan . |
| WO 91/03075 | 7/1991 | WIPO . |

OTHER PUBLICATIONS

Excimer Laser Systems, Inc., Technology Reinvestment Project, "Deep–UV Photoreactive Surface Cleaning", Phase I Proposal, Aug. 25, 1993, Appendices A and B.
Engelsberg, "Removal of Surface Contamination Using a Dry, Laser–Assisted Process", Radiance Services Company, 1993.
Radiance Brochure, Introduction Page, before Jun., 1993.
"Hydrogen–Ion Activity to Laminated Materials, Glass", *Encyclopedia of Chemical Technology*, vol. 13, pp. 628–631. No Date.
Sowell et al., "Surface cleaning by ultraviolet radiation", *Journal of Vacuum Science & Technology*, vol. 11, No. 1, (Jan./Feb. 1974).
Vig, "UV/Ozone Cleaning of Surfaces", *Treatise on Clean Surface Technology*, Plenum Press, pp. 1–26 (1987) No Month.
Brannon et al., "Excimer laser etching of polyimide" *J. Appl. Phys.*, vol. 58, No. 5 (Sep. 1985).
Garrison, "Microscopic model for the ablative photodecomposition of polymers by far–ultraviolet radiation (193 nm)", *Appl. Phys. Lett.*, vol. 44, No. 9 (May 1984).

(List continued on next page.)

*Primary Examiner*—Zeinab El-Arini
*Attorney, Agent, or Firm*—Fish & Richardson P.C.

[57] ABSTRACT

A method of cleaning a substrate surface, the cleaning being done photoreactively without damaging the surface. A laser beam of UV radiation is delivered at an acute angle to the surface of the substrate, the beam striking the surface at a long and narrow reaction region. The beam and the substrate are moved relative to one another to cause the beam to sweep the surface. While the beam is sweeping the surface, a flow of a reactant gas is provided at the reaction region so that the gas is excited by the UV laser beam. The acute angle of the beam is of a value such that foreign material is removed without essentially damaging the surface of the substrate or leaving a residue that would inhibit further processing of the substrate surface.

16 Claims, 24 Drawing Sheets

U.S. PATENT DOCUMENTS

| | | | |
|---|---|---|---|
| 3,503,804 | 3/1970 | Schneider | 134/1 |
| 3,890,176 | 6/1975 | Bolon | 134/20 |
| 4,004,152 | 1/1977 | Obser et al. | 250/562 |
| 4,028,135 | 6/1977 | Vig et al. | 134/1 |
| 4,160,166 | 7/1979 | Etienne et al. | 250/423 R |
| 4,181,538 | 1/1980 | Narayan et al. | 148/1.5 |
| 4,292,093 | 9/1981 | Ownby et al. | 148/4 |
| 4,305,973 | 12/1981 | Yaron et al. | 427/35 |
| 4,393,311 | 7/1983 | Feldman et al. | 250/459.1 |
| 4,414,059 | 11/1983 | Blum et al. | 156/659.1 |
| 4,475,027 | 10/1984 | Pressley | 219/121 L |
| 4,484,334 | 11/1984 | Pressley | 372/101 |
| 4,508,749 | 4/1985 | Brannon et al. | 427/43.1 |
| 4,568,632 | 2/1986 | Blum et al. | 430/322 |
| 4,582,540 | 4/1986 | Allback | 134/1 |
| 4,615,765 | 10/1986 | Levinson et al. | 156/643 |
| 4,643,799 | 2/1987 | Tsujii et al. | 156/635 |
| 4,668,304 | 5/1987 | Schachameyer et al. | 148/1.5 |
| 4,671,848 | 6/1987 | Miller et al. | 156/643 |
| 4,680,616 | 7/1987 | Delahoy et al. | 357/59 |
| 4,687,539 | 8/1987 | Burns et al. | 156/626 |
| 4,692,583 | 9/1987 | Kimura et al. | 219/121 L |
| 4,705,593 | 11/1987 | Haigh et al. | 156/635 |
| 4,718,974 | 1/1988 | Minaee | 156/643 |
| 4,731,158 | 3/1988 | Brannon | 156/643 |
| 4,731,516 | 3/1988 | Noguchi et al. | 219/121 LF |
| 4,733,944 | 3/1988 | Fahlen et al. | 350/167 |
| 4,749,440 | 6/1988 | Blackwood et al. | 156/646 |
| 4,756,047 | 7/1988 | Hayashi et al. | 15/306 B |
| 4,782,029 | 11/1988 | Takemura et al. | 437/11 |
| 4,786,358 | 11/1988 | Yamazaki et al. | 156/643 |
| 4,857,142 | 8/1989 | Syverson | 156/646 |
| 4,870,923 | 10/1989 | Sugimoto | 118/715 |
| 4,877,644 | 10/1989 | Wu et al. | 427/53.1 |
| 4,900,395 | 2/1990 | Syverson et al. | 156/639 |
| 4,938,815 | 7/1990 | McNeilly | 156/612 |
| 4,946,763 | 8/1990 | Snakenborg | 430/308 |
| 5,004,311 | 4/1991 | Peppers | 350/6.9 |
| 5,007,983 | 4/1991 | Lerner et al. | 156/643 |
| 5,022,961 | 6/1991 | Izumi et al. | 156/646 |
| 5,024,968 | 6/1991 | Engelsberg | 437/173 |
| 5,044,314 | 9/1991 | McNeilly | 118/715 |
| 5,099,557 | 3/1992 | Engelsberg | 437/173 |
| 5,114,834 | 5/1992 | Nachshon | 430/329 |
| 5,151,134 | 9/1992 | Boquillon et al. | 134/1 |
| 5,151,135 | 9/1992 | Magee et al. | 134/1 |
| 5,214,685 | 5/1993 | Howells | 378/34 |
| 5,228,206 | 7/1993 | Grant et al. | 34/1 |
| 5,234,540 | 8/1993 | Grant et al. | 156/646 |
| 5,236,512 | 8/1993 | Rogers et al. | 134/1 |
| 5,254,176 | 10/1993 | Ibuka et al. | 134/2 |
| 5,279,705 | 1/1994 | Tanaka | 156/653 |
| 5,289,263 | 2/1994 | Kiyokawa et al. | 356/375 |
| 5,531,857 | 7/1996 | Engelsberg et al. | 156/345 |

OTHER PUBLICATIONS

Huie et al., "Spatial and Temporal Distributions of Particulates Formed from Metallic Surfaces by Laser Vaporization", (1986) No Month.

Srinivasan et al., "Ablative Photodecomposition of Polymer Films by Pulsed Far–Ultraviolet (193 nm) Laser Radiation . . . ", Journal of Polymer Science: Polymer Chemistry Edition, vol. 22, 2601–2609 (1984) No Month.

Srinivasan, "Ablation of Polymers and Biological Tissue by Ultraviolet Lasers", Science, vol. 234 (Oct. 1986).

Chuang, "Laser–enhanced gas–surface chemistry: Basic processes and applications", J. Vac. Sci. Technol., vol. 21, No. 3 (Sep./Oct. 1982).

Schildbach, "A simple analytic model including shielding by the plume during Excimer laser ablation of polyimide", SPIE, vol. 1279 (1990) No Month.

Goldman et al., "Laser–matter interaction at intensities of $10^{12}$ W/cm$^2$ and below", SPIE, vol. 1279 (1990) No Month.

Garrison et al., "Laser ablation of organic polymers: Microscopic models for photochemical and thermal processes", J. Appl. Phys., vol. 57, No. 8 (Apr. 1985).

Huie et al., "Spatial and Temporal Distributions of Particulates Formed from Metallic Surfaces by Laser Vaporization", Analytical Chemistry, vol. 58, No. 9 (Aug. 1986).

Brewer et al., "Large Area Laser–Assisted Etching of Electronic Materials", SPIE, vol. 611 (1986) No Month.

Sutcliffe et al., "Dynamics of UV laser ablation of organic polymer surfaces", J. Appl. Phys., vol. 60, No. 9 (Nov. 1986).

Vig, "Ultraviolet–Ozone Cleaning of Semiconductor Surfaces", Research and Development Technical Report SLC-ET–TR–91–33 (Jan. 1992).

Elliott, "Electronic Materials Surface Processing with Excimer Lasers", Microelectronic Engineering, pp. 435–444 (1986) No Month.

Brewer et al., "Photon–assisted dry etching of GaAs", Appl. Phys. Lett., vol. 45, No. 4 (Aug. 1984).

Ehrlich et al., "Laser–induced microscopic etching of GaAs and InP", Appl. Phys. Lett., vol. 36, No. 8 (Apr. 1980).

Decker, "Kinetic analysis of laser–induced reactions in polymer films", SPIE, vol. 1279 (1990) No Month.

Kokai, "X–ray photoelectron spectroscopy studies on polymer surfaces after KrF laser ablation", SPIE, vol. 1190 (1989). No Month.

Dyer et al., "Excimer laser ablation and thermal coupling efficiency to polymer films", J. Appl. Phys., vol. 57, No. 4, (Feb. 1985).

Arrowsmith, "Laser Ablation of Solids for Elemental Analysis by Inductively Coupled Plasma Mass Spectrometry", Analytical Chemistry, vol. 59, No. 10 (1987).

Keyes et al., "Theory of Photoablation and Its Implications for Laser Phototherapy", J. Phys. Chem., vol. 89, No. 20 (1985) No Month.

Boehly et al., "Measurements of mass ablation rate and pressure in planar targets irradiated by 0.27–μm laser light", J. Appl. Phys., vol. 60, No. 11 (Dec. 1986).

Loper et al. "UV laser–generated fluorine atom etching of polycrystalline Si, Mo, and Ti", Appl. Phys. Lett., vol. 46, No. 7 (Apr. 1985).

Srinivasan, "Action of Far–Ultraviolet Light on Organic Polymer Films: Applications to Semiconductor Technology", Journal of Radiation Curing (Oct. 1983).

Jellinek, "Theory of Etching of Polymers by Far–Ultraviolet, High–Intensity Pulsed Laser and Long–Term Irradiation", J. Phys. Chem., vol. 88, No. 14 (1984) No Month.

Fusion Semiconductor, Primaxx™, Gas Phase Cleaning Module brochure (Jan. 1994).

Baxter, P., "Application Note SAT–110, Cleaning of wafers prior to thermal processing", SEMITOOL, Kallspell Montana, Jul., 1993.

Elliott, D.J., "Contamination Control Using a Nitrogen Purged Mini–Environment", Microcontamination 90 Conference Proceedings, Mar. 1993, Boston, MA.

Peterson et al., "Jet Spray Cleaning of Optics", Proceedings SPIE—The International Society for Optical Engineering, Jul. 23–24, 1992.

Zapka et al., "Efficient pulse laser removal of 0.2 μm sized particles from a solid surface", pp. 2217–2219, Appl. Phys. Lett. 58 (20), 20 May 1991.

Sherman et al., "The removal of hydrocarbons and silicone grease stains from silicon wafers", pp. 563–567, J. of Vacuum Science & Technology B, vol. 8, No. 3, May/Jun. 1990.

Peterson et al., "Contamination Removal by $CO_2$ Jet Spray", Proceedings SPIE—The International Society for Optical Engineering, Jul. 10–12, 1990.

Layden et al., "High velocity carbon dioxide snow for cleaning vacuum system surfaces", pp. 3881–3883, J. of Vacuum Science & Technology A, vol. 8, No. 5, Sep./Oct. 1990.

David J. Czaplicki, "Bar Code Scanning", p. 102, Packaging Encyclopedia, 1989 No Month.

Elliott, D.J., "Integrated Circuit Fabrication Technology", 2nd Edition, p. 145, McGraw Hill, New York, N.Y., 1989.

Polasko et al., "Very large scale integrated pattern registration improvement by photoablation of resist–covered alignment targets", pp. 389–393, J. Vac. Sci. Technol. B 6 (1), Jan./Feb. 1988.

Elliott et al., "Photoablation of Resist Coated Alignment Targets to Improve VLSI Pattern Overlay", pp. 172–175, SPIE, vol. 774 (1987).

Elliott et al., "Materials Surface Processing with Excimer Lasers", pp. 1090–1096, Proceedings of the International Conference on Lasers '87, Dec. 7–11, 1987.

"Scan marking: application to metal marking", Lambdaphysik, Feb. 1987.

"Glass marking", Lambdaphysik, Oct. 1986.

Elliott et al., "Materials Surface Processing with Excimer Lasers", Materials Research Society Fall Meeting and Show Technical Program, Boston, MA, Dec. 2, 1986.

Elliott et al., "VLSI Surface Processing with Excimer Lasers", Semicon East Technical Program, Boston, MA Sep. 1986.

"Photoablation' with Excimer Laser Improves Alignment", Semiconductor International, Dec. 1986.

Brewer et al., "Laser–Assisted Dry Etching", pp. 273–280, Solid State Technology/Apr. 1985.

Elliott, D.J., "Integrated Circuit Mask Technology", pp. 50–58, McGraw Hill, New York, N.Y. 1985 No Month.

Jain et al., "Excimer laser projection lithography", pp. 645, 649, Applied Optic, vol. 23, No. 5, Mar. 1984.

Srinivasan, R., "Action of Far–Ultraviolet Light on Organic Polymer Films: Applications to Semiconductor Technology", IBM T.J. Watson Research Center, Yorktown Heights, N.Y. (1984) No Month.

Davis et al., "Direct Photoetching of Resist Materials Using Excimer Lasers", pp. 1–8, Microcircuit Engineering 83, 1983 No Month.

Bolon et al., "Ultraviolet Depolymerization of Photoresist Polymers", pp. 109–111, Polymer Engineering and Science, vol. 12, No. 2, Mar. 1972.

"Mask Quality Glass", pp. 50–53, 57–59, Integrated Circuit Mask Technology (published before Aug. 29, 1993).

R. Srinivasan, "Ultraviolet Laser Ablation of Organic Polymer Films", IBM Thomas J. Watson Research Center, Yorktown Heights, N.Y. (1984).

Surface Preparation (published before Aug. 29, 1993).

Jerzy Ruzyllo, "Overview of Dry Wafer Cleaning Processes", pp. 201–231, Handbook of Semiconductor Wafer Cleaning Technology (published before Aug. 29, 1993).

John R. Vig, "Ultraviolet–Ozone Cleaning of Semiconductor Surfaces", pp. 233–273, Handbook of Semiconductor Wafer Cleaning Technology (published before Aug. 29, 1993).

R. Srinivasan, "UV laser ablation of polymeres and biological tissues", Lamda Highlights No. 1 (published before Aug. 29, 1993).

"Pulse Shortening of XeCl laser radiation", Lamda Highlights No. 1 (published before Aug. 29, 1993).

Waterlase–Product Description (published before Aug. 29, 1993).

Leitz–IMS "Alpha Alignment Mark Photoablation Systems" (published before Aug. 29, 1993).

Leitz–IMS "Alpha Alignment Mark Photoablation System" (Sep. 1986).

William C. Schumay, Jr., "New Laser Applications in Microelectronics", Advanced Materials & Processes, Oct. 1986.

Leitz–IMS "XLR–100 Excimer Laser Research Center" (1986) No Month.

Leitz–IMS "News Release" (Apr. 15, 1986).

Listing of Abstracts–A.

Listing of Abstracts–B.

Listing of Abstracts–C.

Fig. 3 as originally filed in Nachshon, U.S. Serial No. 260,526, filed Oct. 21, 1988, corresponding to the parent application of U.S. Patent No. 5,114,834.

PHOTOREACTIVE SURFACE PROCESSING

This is a continuation of prior application Ser. No. 08/532,992 filed on Sep. 25, 1995, now abandoned, which is a continuation of Ser. No. 08/298,023 filed Aug. 29, 1994, now abandoned, which is a continuation-in-part of application Ser. No. 08/118,806, filed Sep. 8, 1993, now abandoned, by David J. Elliott, Richard F. Hollman, Francis M. Yans, and Daniel K. Singer for SURFACE PROCESSING.

BACKGROUND

This invention relates to surface processing.

Surface cleaning, for example, is an important step in making, e.g., semiconductor components such as integrated circuits, memory chips, thin film heads, flat panel displays, and CD-ROMs. Foreign material on the surfaces of such components has a direct bearing on process yields, and this is especially so as device sizes become smaller. Even a monolayer of sodium ion contamination on the surface of an integrated circuit may cause the circuit to malfunction. Surface cleaning also plays an important role in the biotechnology and medical fields, e.g., in the manufacture and purification of culture strains, and in the cleaning of surgical instruments.

Foreign material to be removed by surface cleaning frequently includes organic molecules. Although it has long been known that ultraviolet (UV; defined by the wavelength range of 4 nm to 380 nm) light decomposes organic molecules, only in the last few years has UV cleaning of surfaces been explored.

One contaminant that is particularly difficult to clean from a wafer surface is patterned photoresist that has been hardened (at least at its exposed surface) by ion bombardment in the course of an ion implantation processing step.

Within the phrase "surface cleaning" or "surface processing" we broadly include, among other things, any removal of foreign material from a surface, surface state changes (e.g., hydrogen ion termination), moisture removal, surface priming (e.g., for photoresist adhesion), and deoxidation.

SUMMARY

In general, in one aspect of the invention foreign material on a surface of a substrate is processed to form a reaction product(s), by the combination of providing a directed flow of a fluid, including a reactant, in the vicinity of the foreign material, and delivering a beam of radiation to aid the reactant to react with the foreign material to form the reaction product(s).

Implementations of the invention may include the following features.

The reactant may be a gas flowing at a velocity preferably between 50 mm/sec and 20,000 mm/sec, more preferably between 100 mm/sec and 10,000 mm/sec, and most preferably between 200 mm/sec and 5,000 mm/sec. When the foreign material includes organic material, the reactant may include an oxidant such as oxygen, chlorine, fluorine, or molecules containing oxygen, chlorine or fluorine, and the beam may be ultraviolet radiation. When the foreign material includes a metal oxide, the reactant may include chlorine, fluorine or a fluorine or chlorine containing molecule. When the foreign material includes silicon or silicon dioxide, the reactant may include fluorine or a fluorine containing molecule such as a fluorocarbon. When the foreign material includes bacteria, the reactant may include an oxidant.

The fluid may include an inducer gas in the vicinity of the reactant to assist the reactant to react with the foreign material. The inducer gas may be a member of the group consisting of $NH_3$, $H_2$, $N_2O$, and fluorocarbons. The fluid may include a diluent gas (e.g., helium) to reduce the viscosity of the reactant, or to reduce the ultraviolet absorption coefficient of the reactant (e.g., a member of the group consisting of nitrogen, helium and argon).

The fluid may be a liquid flowing at a velocity preferably between 0.2 mm/sec and 2,000 mm/sec, more preferably between 0.5 mm/sec and 1,000 mm/sec, and most preferably between 1 mm/sec and 500 mm/sec. The depth of the substrate surface below the surface of the liquid may be less than 50 mm, and preferably less than 20 mm. The reactant may be selected to match reaction characteristics of the foreign material.

The substrate and the flow of the fluid may move relative to one another. The fluid may be a gas directed at an angle of less than 90 degrees to the surface, preferably the angle may be between 0 and 30 degrees, more preferably between 0 and 20 degrees.

The fluid may be directed to a region above the surface, and the flow may be turbulent flow. The reaction product and the fluid may be sucked away from the surface. The fluid may be delivered through a nozzle having an opening in the vicinity of the foreign material. The directed flow may be of a sequence of fluids, e.g., including a gaseous reactants preceded or followed by another fluid which could include a different gaseous or liquid reactant. The process may include elevating the temperature of the reactant prior to its being provided in the directed flow, or of the foreign material, or of the substrate. The atmospheric pressure in the vicinity of the foreign material may be raised or lowered above or below the ambient. The fluid may include a non-reactive carrier medium.

The step of providing a directed flow of a fluid may include delivering a gas to a location in the vicinity of the foreign material and forming the reactant from the gas in the vicinity of the foreign material. The reaction product may consist only of gaseous material.

In general, in another aspect, the invention features delivering the beam of radiation at an angle of less than 90 degrees to the surface to aid the reactant to react with the foreign material to form the reaction product.

Implementations of the invention may include the following features. The beam is delivered to the surface at an energy level insufficient to damage the surface. The beam may be delivered by receiving a source laser beam and focusing the cross-sectional size of the beam in one dimension and broadening the cross-sectional size in another dimension. The size along one of the dimensions may be at least as great as the width of the substrate and the size along the other dimension may be chosen to provide an energy density insufficient to damage the surface. The beam may be configured to cause ablation of the foreign material at an ablation surface which is normal to the beam and not parallel to the surface of the substrate. Relative motion may be caused between the surface and the beam to cause the beam to sweep the surface, and the surface may be swept first along one dimension and then along another dimension. The energy characteristics of the beam may be controlled to match absorption characteristics of the foreign material. The angle of the beam to the surface may be between 0 and 30 degrees, more preferably between 10 and 20 degrees, and most preferably between 12 and 15 degrees. Beam radiation reflected from the surface may be collected and reflected back to aid the reactant to react with the foreign material. The beam may be a laser beam with a long, narrow cross-section and include ultra-violet radiation in the wavelength range 4 nm to 380 nm. The beam cross-section may be at least as long as the surface is wide.

In general, in another aspect, the invention features forming the beam of radiation with a pre-defined non-uniform cross-sectional intensity profile. In implementations, the profile may include a higher intensity central region with lower intensity peripheral regions. The profile may be formed by superimposing light beams of different wavelength, each having a preselected intensity profile, e.g., by frequency multiplying a single laser source; or by superimposing focused and unfocused versions of a source beam. The surrounding lower intensity regions of the profile are formed by a UV floodlamp that produces relatively high energy density light at wavelengths below 200 nm.

In general, in another aspect, the invention features scanning the beam across the surface in more than one scan with less than all of the processing being done in any one scan. In implementations, the total scan time for all scans may be less than the time which would otherwise be required to perform the same processing in a single scan.

In general, in another aspect, the invention features delivering an array of distinct beams of radiation to aid the reactant to react with the foreign material to form the reaction product simultaneously at an array of locations on the surface. In implementations of the invention, the array may be scanned across the surface. The array of distinct beams may be configured to permit complete coverage of the surface by scanning a distance less than the full extent of the surface. A first beam may be split into at least two spaced-apart beams having respective energy densities lower than the energy density of the first beam.

In general, in another aspect of the invention, acoustic energy (e.g., pulsed) is delivered to aid the reactant to react with the foreign material to form the reaction product. In implementations, the acoustic energy may serve to remove particles of foreign material from the surface.

In general, in another aspect of the invention, a plasma discharge is provided to aid the reactant to react with the foreign material to form the reaction product.

In general, in two aspects of the invention, the temperature of the surface is elevated prior to delivering the beam; and a catalyst is provided in the vicinity of the surface.

In general, in another aspect of the invention, the configuration of the flow is arranged so that components of the fluid form reactants in the vicinity of the foreign material.

In general, in other aspects of the invention, the steps of (a) scanning a laser beam across a surface and (b) flowing a reactant gas in the direction of a reaction zone in the vicinity of the intersection of the beam with the surface are used to clean the surface of a semiconductor wafer to remove ion-implanted patterned photoresist; or to remove ink dots placed on semiconductor wafers during a test procedure; or to clean the surface of a thin-film magnetic disk read-write head substrate to remove patterned photoresist; or to clean a flat panel display substrate to remove a film of an organic material (e.g., polyimide) from selected areas; or to clean disks used in the manufacture of compact disks to remove organic and/or metal films.

Ion-implanted photoresist may be removed by scanning the laser beam until a top portion of the ion-implanted photoresist is removed, wetting the ion-implanted photoresist with a liquid comprising a liquid reactant, and applying laser energy to the ion-implanted photoresist through the liquid. Wetting may comprise flowing a liquid over the ion-implanted photoresist or immersing the ion-implanted photoresist in a bath containing the liquid.

Implementations of the invention may include the following features. The surface of the substrate may be held in a non-horizontal orientation (e.g., upside down or vertically) during processing. The surface to be processed may be treated continuously. The substrate may be continuous and elongated, e.g., as a wire or tape, or may be in consecutive pieces that are placed on a moving conveyor belt or web, and the processing may be performed continuously along the length of the web.

Among the advantages of the invention are the following.

Surface cleaning converts foreign material on a substrate surface from a solid to a gas form. This makes it easier to transport the foreign material from the surface. High efficiency is achieved by selecting parameters which are tuned for the particular type of foreign material that is to be removed, maximizing the energy transfer to the foreign material and minimizing the energy transfer, and thus the possibility of damage (e.g., due to heat, shock wave, or other effects), to circuitry and other features on the surface, and to the surface itself.

Surface cleaning according to the invention provides important advantages to the semiconductor industry. Cleaning with radiant energy and low volumes of reactant gases results in low volumes of relatively harmless product of oxidation or other types of reaction products. This reduces the environmental impact of the cleaning process and increases operator safety, compared with the standard wafer cleaning practice in which large volumes of concentrated acids, bases, organic solvents, and even larger volumes of contaminated rinse water are used. In addition, we have estimated that the overall cleaning cost for, e.g., wafer cleaning will be one-twentieth of the cost associated with conventional cleaning methods. The invention enables rapid surface cleaning, with an estimated cleaning time for a 200 mm diameter wafer of between 30 and 60 seconds, depending upon the nature of the foreign material on the wafer surface. Also, surface cleaning according to the invention eliminates the problems associated with conventional plasma and early UV cleaning methods such as electrical fields, induced currents and high energy reactions which are potentially harmful to semiconductor devices and substrates.

The size of the smallest particle capable of causing a defect in an integrated circuit is decreasing as the semiconductor industry pushes for smaller circuit dimensions. As particle sizes decrease, surface cleaning techniques that simply rely on breaking adhesive forces to physically remove these small particles become less efficient, because the energy required to remove the contaminants becomes comparable to the energy sufficient to damage a surface (e.g., 10,000 psi of pressure is not sufficient to remove 0.25 micron particles from a semiconductor surface). Surface cleaning according to the invention, on the other hand, can remove particles having a dimension of 0.25 μm and smaller from a surface without damage.

Other advantages and features will become apparent from the following description and from the claims.

DESCRIPTION OF PARTICULAR EMBODIMENTS

Figure 1:
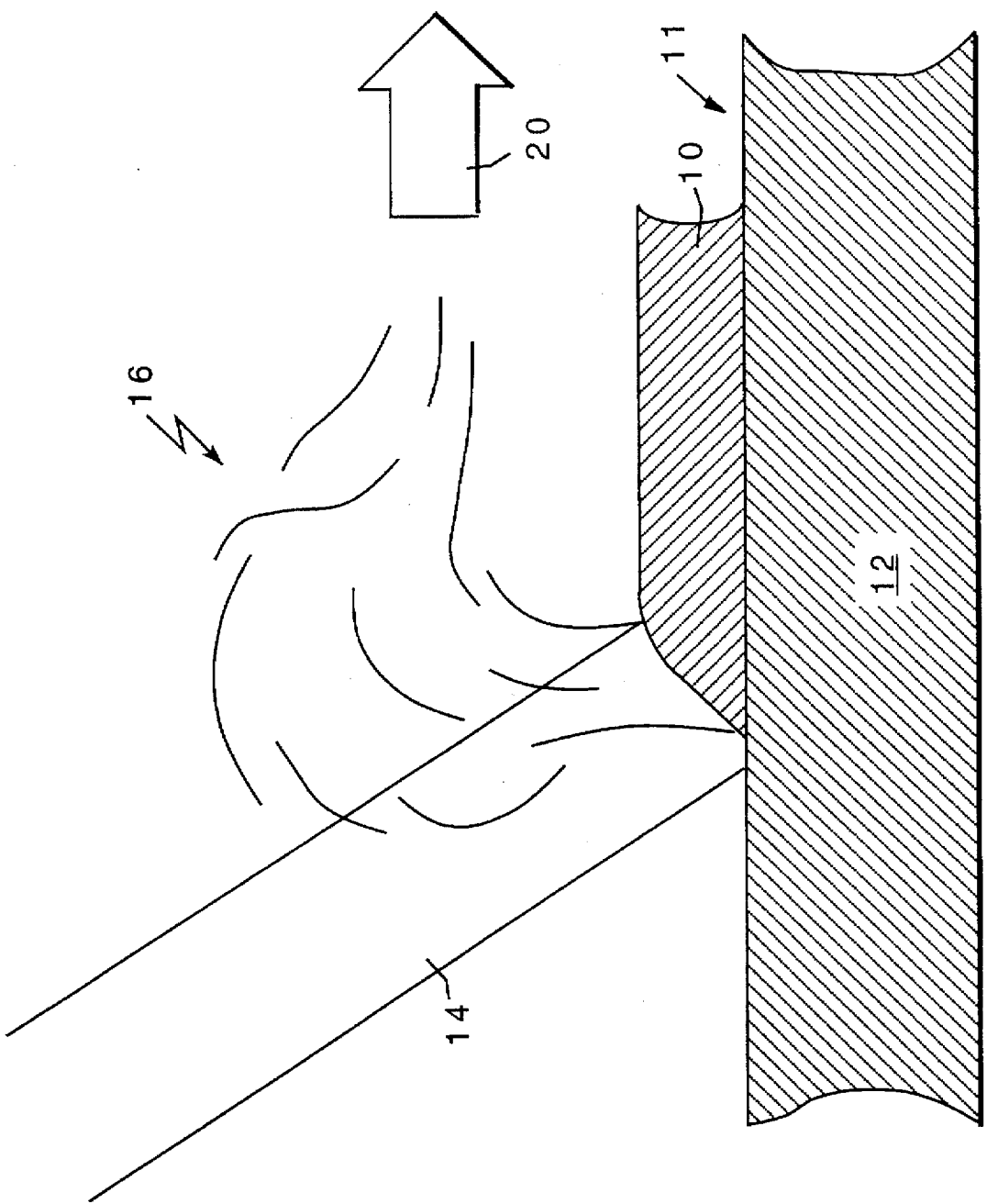
FIG. 1 is a schematic sectional side view of a substrate being cleaned.

Referring to FIG. 1, foreign material 10 may be removed from a surface 11 of a substrate 12, by delivering to the foreign material energy 14, which ablates the foreign material from the surface, i.e., the components of the foreign material dissociate into, e.g., molecules, free radicals, and small particles ("ablation components") which expand and rise above the substrate surface as a cloud 16.

An input fluid 18 (e.g., an elemental gas (e.g., $Cl_2$, $O_2$ $O_3$, $F_2$), a mixture of elemental gases (e.g., He and $O_2$), a gas-phase compound (e.g., CO or $CF_4$), a mixture of one or more of these gases, or a liquid (flowing or static)) is used to reduce or prevent the ablation components of the foreign material in the cloud from redepositing onto the substrate surface by, e.g., reacting with the ablation components to form simple gases ("reaction products," e.g., gases) or entraining the ablation components in a gas flow away from the substrate. The formation of the reaction products is generally associated with the generation of heat and light, some of which may be visible. The ablation components of the foreign material, the reaction products in the cloud, and the volatile compounds formed at the surface are then removed from the vicinity of the substrate, as indicated by arrow 20, and the surface is left clean.

Reactions in which the foreign material reacts directly with reactive species in the input fluid to form volatile compounds may occur at the surface. Energy 14 may be absorbed by components of the input fluid to generate excited species that react with the foreign material to produce reaction products in the cloud or volatile compounds at the surface in the absence of ablation.

By careful control of the process, a variety of foreign materials may be efficiently removed without damage to the surface and features on the surface. Careful selection of certain reaction conditions ensures that most of the ablation components in the cloud completely react with reactive species in the input gas, instead of forming particulates or other materials that redeposit onto the substrate surface. The process aspects to be controlled include the form of the delivered energy (e.g., laser radiation possibly augmented by acoustic energy or plasma discharge), the way the energy is delivered (angle of incidence of the energy beam, energy density and distribution, wavelength distribution, shape and dimension of the irradiated region of foreign material, beam pulse rate), the input fluid (composition, temperature, velocity, flow volume, angle of delivery, delivery location, gas pressure), the removal of the cloud (entraining gas flow, vacuum exhaust), and the reaction conditions (submerged reactions; substrate pretreatment; reaction chamber conditions; substrate temperature; input fluid temperature, pressure, and velocity; number of scans and pattern of scanning; catalysts).

Proper selection of parameters minimizes heating and other undesirable conditions which could damage the surface or features on the surface. Parameters can be selected for optimal targeted removal of specific foreign material.

Foreign Material in General

Foreign material on substrates includes, e.g., contaminants, organic layers, and residues.

Contaminants

Many contaminants found on substrates are inherent to processing environments; these include particulates from the air (e.g., dust, lint, gas-phase oxides, metals, water, atmospheric debris and stains) and from process technicians (e.g., skin). The steps required for processing a substrate into a finished product also contribute to surface contamination (e.g.: polymer residues, photoresist layers, and silicon dust from integrated circuit processing; copper, aluminum, permalloy, epoxy, and phenolic from printed circuit fabrication; and oxides and glass particles from flat panel display manufacturing).

While most contaminants found on substrates are organic molecules (including: carbon, hydrogen, oxygen, nitrogen, sulfur; trace metals, such as iron and sodium; and trace oxides), other contaminants may be present, such as metals (e.g., copper, aluminum, brass, and iron), silicon, oxides (e.g., silicon oxide and aluminum oxide), and minerals (e.g., gypsum). Each type of contaminant may require selection of different parameters for efficient removal.

Organic Layers

An important application of surface cleaning is the removal of organic layers (e.g., polymers, photoresist, polyamide, polyimide and ink) from surfaces. Organic layers typically have thicknesses that range from 0.2 μm to 25 μm, and compared with residues and contaminants, organic layers involve much greater volumes of material to be removed. Therefore, a relatively greater quantity of input gas is required to react with and/or entrain the ablated organic material. Ablation provides a convenient way to efficiently remove organic layers by converting the ablated solid organic material into a large volume of gas (larger than when in solid form). In gaseous form, the ablated organic material can more easily mix with the reactive species in the input gas. This helps the ablated material to react with the reactive gas species at a high rate and form a volatile product before the ablated material can redeposit on the wafer.

The definition of "complete" stripping of an organic (e.g. photoresist) layer is dependent upon the application. For example, audio compact disks do not require as stringent a level of cleanliness as do semiconductors. A layer of photoresist 2000 Angstroms thick was adequately removed from a compact disk "father" as described in a later section by the use of a laser and oxygen without the need for any more extensive processing. The "father" performed to excellent industry standards even though there may have been residual photoresist left on the surface.

On the other hand, semiconductor processing cannot tolerate such incomplete removal of photoresist. For example, we have determined that the stripping of patterned photoresist from semiconductor wafers using a 193 nm wavelength excimer laser beam and a flow of oxygen leaves a residue of carbon from the photoresist, of a thickness up to 200 Angstroms. This has been determined by Auger and SIMS analysis of surfaces that appeared visually "clean". This carbon residue must be removed prior to further processing of the semiconductor wafer such as, for example, epitaxial growth or the deposition of a metal layer. Otherwise, the device performance (e.g. through excessive contact resistance between conducting layers) or reliability (e.g. through delamination of layers later in the process) will be compromised. Gaseous reactants which are more aggressive than oxygen can be used to reduce or possibly eliminate this carbon residue. Otherwise, it may be removed by following partial removal of the photoresist via laser cleaning in oxygen either by a brief wet cleaning step, or by a follow-up laser scan with the wafer immersed in a flowing liquid solution.

Residues

Typically, during cleaning of foreign material that is difficult to remove, the foreign material is transformed into residues or other modified states that can be very difficult to remove, and cannot be removed by additional cleaning using the same process. For example, photoresist that has been subjected to the ion implantation process is not only difficult to remove from a surface, but also tends to leave a residue on the surface after, e.g., laser or plasma cleaning. Photoresist that has been subject to ion implantation becomes a different material due to chemical molecular cross-linking and evaporation of volatiles. Cleaning this material is very different than cleaning photoresist.

Surface Cleaning

Surface cleaning procedure begins by identifying the foreign material on the substrate surface with Auger analysis, ESCA or other appropriate analytical techniques. Subsequently, various parameters are selected to achieve optimal removal of the identified foreign material.

Input Energy Selection

Efficient surface cleaning requires optimization of the characteristics of the energy delivered to the foreign material. This generally requires consideration of the energy absorption characteristics and the ablation characteristics of the foreign material, the substrate, the input gas, and the cloud of ablation components. Ideally the appropriate energy characteristics coincide, as closely as possible, with the peak in the absorption characteristics of a given foreign material to be cleaned (noting that the amount of energy reaching the foreign material also depends on the absorption characteristics of the surrounding atmosphere).

Laser Energy

When the energy is delivered by a pulsed laser the energy density used in the removal of foreign material depends largely on the type and amount of the foreign material and the need to avoid damaging the substrate.

Beam Energy Density

The energy density of a laser beam pulse is defined herein as the beam intensity, measured normal to the direction of beam propagation integrated over the duration of the pulse; we will ignore the variation of the intensity during a pulse (this is generally not an important consideration for typical lasers and pulse energies used for surface cleaning). The energy density range, as defined herein, lies between the energy density at which cleaning begins and the level at which the substrate surface first becomes damaged.

Generally, the selected pulse energy density increases with the boiling point of the particular foreign material to be removed. Organic materials tend to have relatively low boiling points, whereas inorganic materials generally have much higher boiling points and typically require higher energy densities for efficient removal. However, this range may vary depending on the values selected for other parameters. For example, the selected energy density will also depend on the quantity of foreign material to be removed, the desired substrate cleaning rate, the reaction efficiency of the reactive species in the input fluid, and the need to avoid damaging the substrate. If the energy density is high, the substrate may be damaged. If the energy density is low, little or no foreign material may be removed. For example, an input gas containing oxygen and radiation with a wavelength of 248 nm can be used to remove a layer of photoresist 1 micron or greater in thickness from a silicon wafer. In this case, an energy density greater than 1000 mJ/cm$^2$, normally incident, may damage the device structures fabricated on the silicon wafer, while a density less than 150 mJ/cm$^2$ may not remove photoresist at all. If a very efficient reactive species is used, a low energy density can be applied, while still efficiently removing the ablation components.

Organic materials tend to strongly absorb UV radiation and tend to have ablation characteristics in which the ablation rate is not substantial until the energy density of the applied pulses is greater than the ablation threshold of the foreign material. Above this threshold the ablation rate increases with an increase in energy density. Organic materials (e.g., photoresist) tend to ablate (break down into volatile components) photolytically (i.e., as a result of light absorption) and/or thermally (i.e., as a result of heating), depending upon the wavelength of the laser light.

In the case of stripping ion-implanted photoresist from a semiconductor wafer, the substrate damage threshold for a normally incident beam has been found to be as low as 200 mJ/cm$^2$. However, with a beam incident at an angle of 80° with respect to normal, energy densities from 500 mJ/cm$^2$ to 2000 mJ/cm$^2$ can be applied to the same wafer without damaging the wafer.

Typical substrates (e.g., semiconductor wafers), are formed from inorganic materials which are not strong absorbers of UV radiation and/or have relatively high ablation thresholds. The energy density constraint required for removal of high boiling point inorganic materials may be relaxed by proper selection of other parameters. For example, consider a substrate which bears an inorganic material e.g., a refractory metal that has a very high boiling point. By applying laser pulses at an oblique angle to the surface of the substrate, as described in detail below, a sufficiently high energy density can be used to remove the inorganic material without damaging the surface because, e.g., at such an angle of delivery most of the beam energy is absorbed by the contaminant and very little energy is absorbed by the substrate. Also, exposing inorganic foreign material to an appropriate reactive species helps to remove refractory metals by forming volatile reaction products at the surface, which can be easily entrained in a flow of gas or liquid, e.g., containing the reactive species.

It has also been observed that immersing the substrate in a liquid reduces the energy density requirement for cleaning (see the section of the present application entitled "Submerged Reactions"). In this case, foreign material (e.g., a thin layer of amorphous carbon residue) can be removed by a much lower energy density than that generally required for ablation of organic films not submerged in a liquid. We believe the laser energy excites the reactive species in the liquid and localized heating of the surface accelerates the reaction between the foreign material and the excited reactive species. Generally, the density of excited species produced will be proportional to the energy density of the applied laser pulses (although the efficiency of the process is determined by the total number of excited species produced, which is proportional to the total pulse energy). Results indicate that energy densities in the range of 20 mJ/cm$^2$ to 200 mJ/cm$^2$ can be used to efficiently remove submerged organic foreign material from a surface.

Beam Spatial Characteristics

The spatial characteristics (shape and dimension, energy density profile, wavelength distribution) of the laser beam pulses illuminating the foreign material may be selected to enhance the reaction between the ablation components and the reactive species in the input gas. Proper selection of the spatial characteristics of the applied beam also reduces the tendency for redeposit and improves the tendency for uniform removal of foreign material.

Beam Shape and Dimensions

The cross-sectional shape and dimensions of the laser radiation are selected to provide efficient surface cleaning at a high rate within the constraints of certain other parameters (e.g., the energy of the laser).

The energy density requirements and the energy per pulse available from the laser source limits the size and shape of the beam. For example, an excimer laser at a wavelength of 248 nm typically produces pulses of 80 mJ. Without considering losses in the optical system, such a laser can illuminate at most 0.2 cm$^2$ with an energy density of 400 mJ/cm$^2$.

For raster scanning of the beam in a two-dimensional array, the simplest beam shape to use is rectangular because the output beam from typical commercially available excimer lasers is rectangular (for example, approximately 10 mm×20 mm from the Cymer CX-2 laser). The most straightforward way of using this beam is to deliver the beam directly from the laser source to the substrate surface or to use one or two spherical lenses or mirrors to form a magnified or demagnified image of the beam at the substrate surface. Typically, the transverse cross-section of the beam has a Gaussian energy density profile across one axis and a uniform energy density profile across the other axis. If no measures are taken to make the transverse cross-sectional energy density profile of the beam spatially uniform, the beam should be scanned across the surface in the direction of the greatest non-uniformity to enhance the uniformity of surface illumination.

An elongated beam is preferred under certain conditions because such a beam shape is compatible with a surface cleaning system that uses unidirectional scanning of the laser beam (delivered using, e.g., stationary optics and linear translation of the substrate, e.g., in the direction parallel to the narrow dimension of the laser beam).

Figure 2:
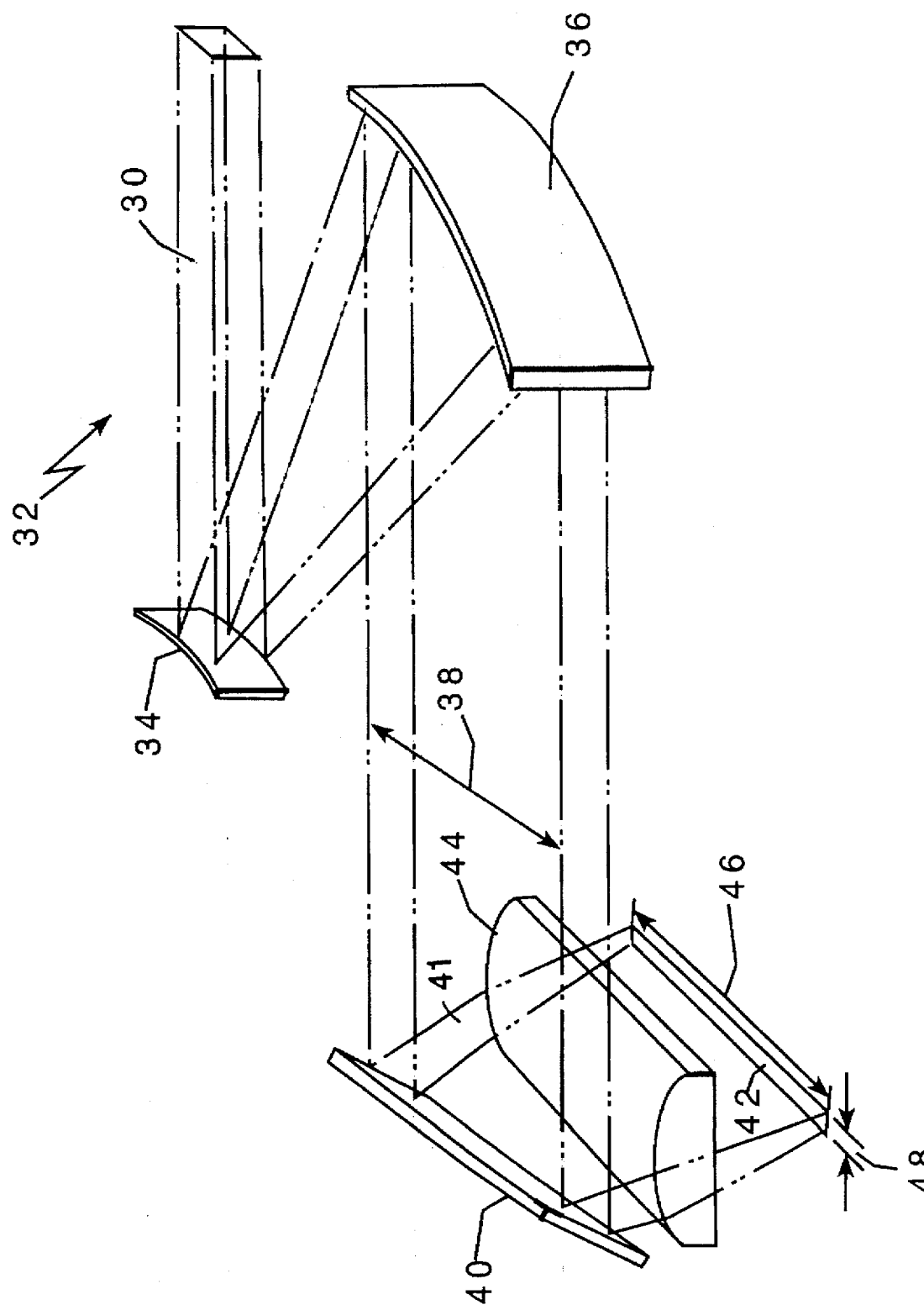
FIG. 2 is a perspective view of a beam expanding system.
Figure 2A:
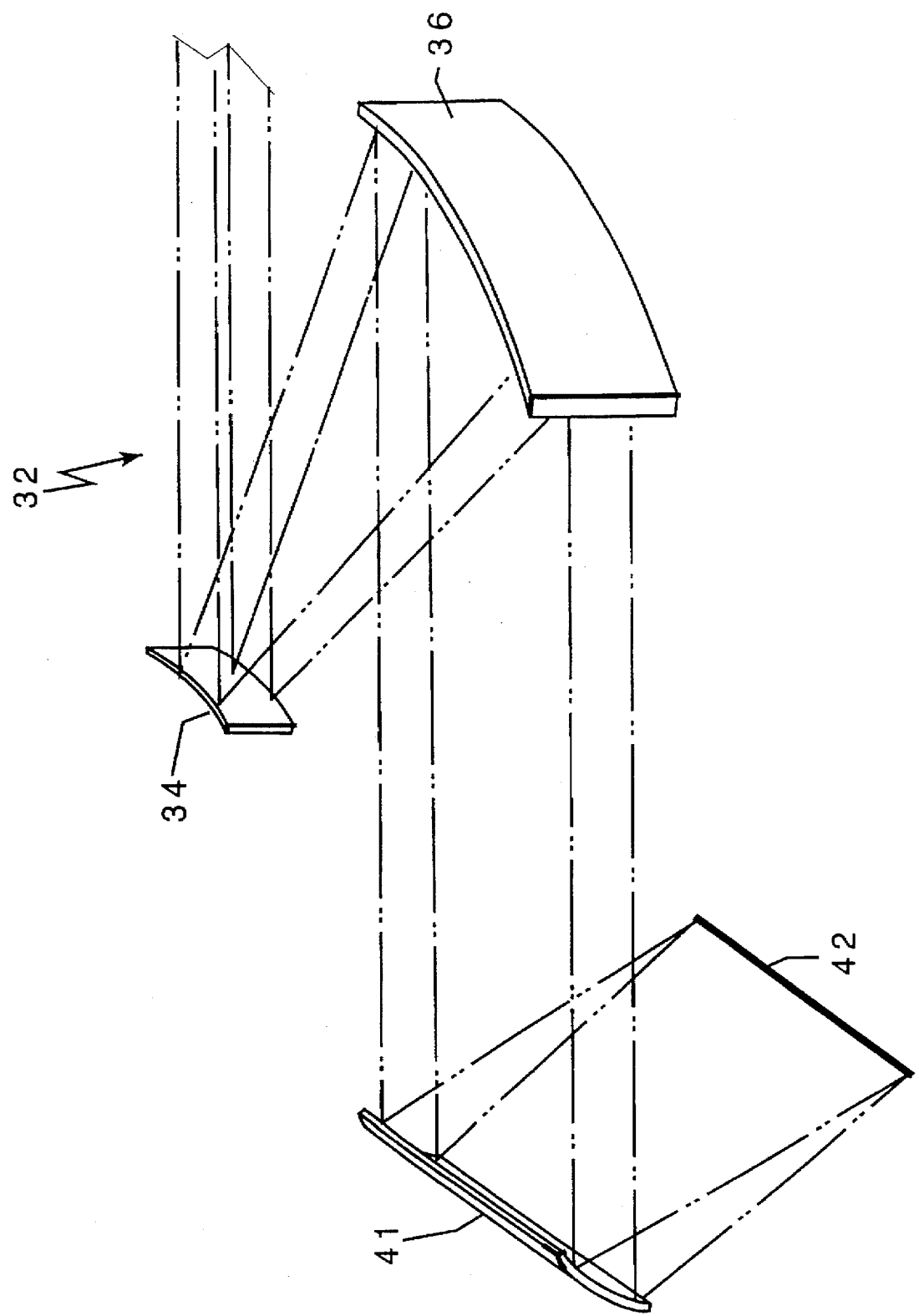
FIG. 2A is a schematic side view of a beam directing technique.

Referring to FIGS. 2 and 2A, the elongated dimension 46 of beam 42 at a substrate surface is selected based largely upon the size of the substrate to be cleaned, whereas the narrow dimension 48 of the beam is selected largely by the beam energy supplied by the laser; both of these parameters are governed by the energy density required for efficient cleaning. In a particular embodiment, shown in FIG. 2, a beam expanding system 32 may include a pair of cylindrical mirrors 34 and 36, with vertical cylinder axes, which expand the beam along one dimension to a width 38 of, e.g., 200–250 mm. A mirror 40 delivers beam 42 to a lens 44 (a cylindrical refractive lens) which focuses beam 42 in elongated region 46 so that at the place where it strikes the substrate surface it has a width of, for example, less than 0.5 mm along dimension 48. Thus the final beam striking the surface gives the appearance of a knife edge. Alternatively, flat mirror 40, may be replaced by a cylindrical focusing mirror 41, as shown in FIG. 2A.

Figure 2B:
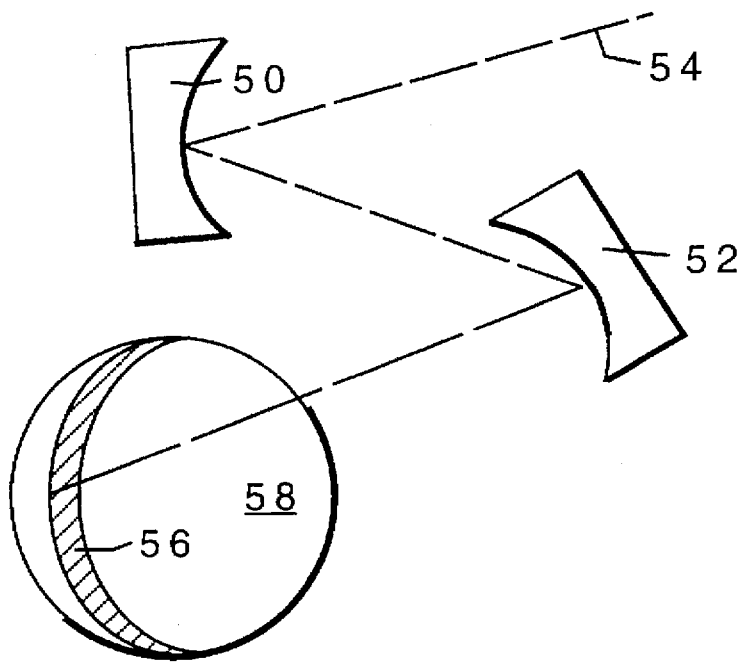
FIG. 2B is a schematic view of another beam directing technique.

The beam need not be rectangular. As shown in FIG. 2B, a pair of mirrors 50 and 52 could be arranged to act cooperatively on an incoming light beam 54 generated by a deep UV light source to produce a half-moon-shaped region 56 of illumination on a substrate surface 58 which has the advantage of concentrating particulate debris generated toward the center of the beam where it can be drawn off more easily by a vacuum nozzle.

Also, the size of the illuminated region on the surface may be made larger, e.g., to the point where the entire surface of the substrate is illuminated. As discussed above, higher laser energies permit larger beam dimensions for a given energy density (one of the constraints that should be optimized for efficient surface cleaning).

Reflective optical elements (mirrors) are generally preferred over refractive optical elements (lenses) for part or all of the beam-forming system because the material forming reflective optics can be selected on the basis of thermal stability (e.g., Zerodur), as opposed to optical transmission criteria required for refractive elements. Also, properly prepared reflective surfaces can withstand much higher beam intensities than refractive elements (this is an especially important consideration when shorter wavelengths, such as 193 nm, are used). Finally, reflective optical elements will direct light of different wavelengths to the same location, which is useful for beams that include multiple wavelengths of light.

Energy Density Profile

The optics delivering the radiation to the wafer surface may be adapted to provide a tuned energy density profile for each laser pulse to optimize the cleaning process and enhance the reaction between the ablation components (also called "ablated foreign material") and the reactive species in the input gas.

Figure 3:
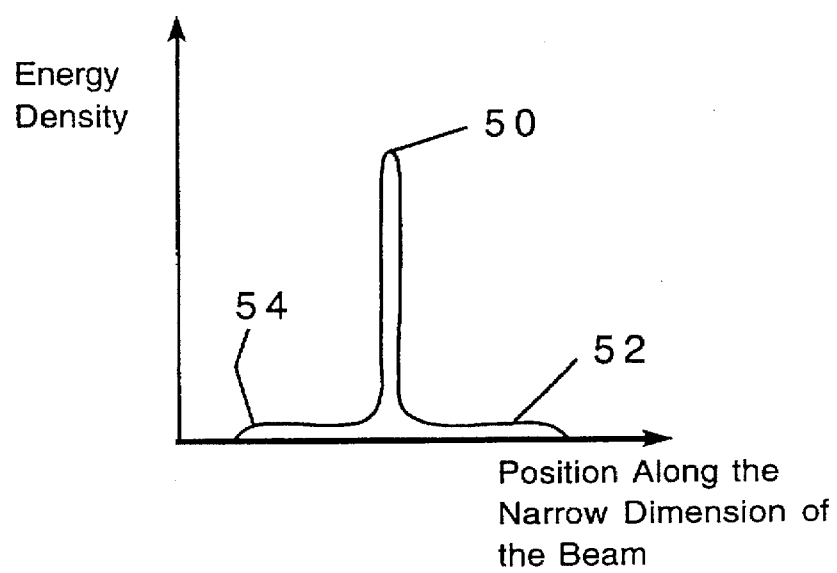
FIGS. 3, 3A, 3B, 3C and 3D are plots of beam energy density.

Referring to FIG. 3, the energy density profile along the narrow dimension of an elongated beam may have a central high energy density region 50 and a broad low energy density region having a leading edge 52 and a trailing edge 54. It is speculated that the profile of FIG. 3 enhances the cleaning process by "pre-exciting" the foreign material with a low energy density, before the high energy density region 50 ablates the material. It is also speculated that the energy density profile shown in FIG. 3 alters the formation dynamics of the resulting cloud of ablation components in a manner that reduces redeposition by causing the cloud of ablation components to flow away from the previously cleaned regions of the wafer.

High intensity region 50 would typically be 20 μm to 100 μm wide with an energy density greater than 200 mJ/cm$^2$ per pulse, while the remaining part of the beam could be as broad as 3 mm and have an energy density of 20 mJ/cm$^2$. If the illuminated surface is submerged in a liquid, the broad, lower intensity portion of the beam would be useful for generating a high concentration of reactive species in solution (for example, Cl or oxygen ions), which would diffuse to the cloud of ablation components, whereas the higher intensity portion would be useful for locally heating the surface and initiating the reaction. When the applied pulses are delivered at an oblique angle of incidence, the energy density profile could be quite different. Measured in a plane normal to the direction of beam propagation, the energy density of region 50 may be as high as 2000 mJ/cm$^2$ without causing damage to the substrate.

Figure 3A:
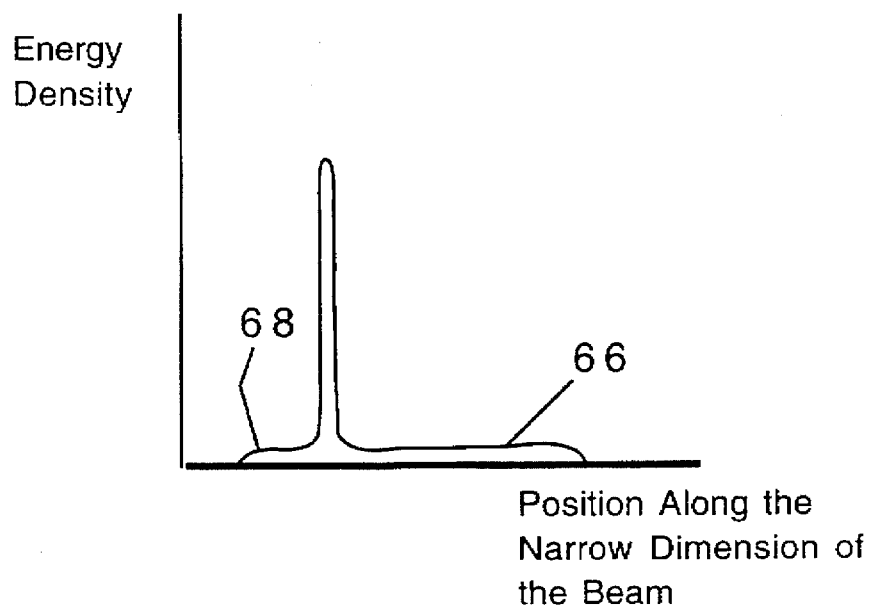
Figure 3B:
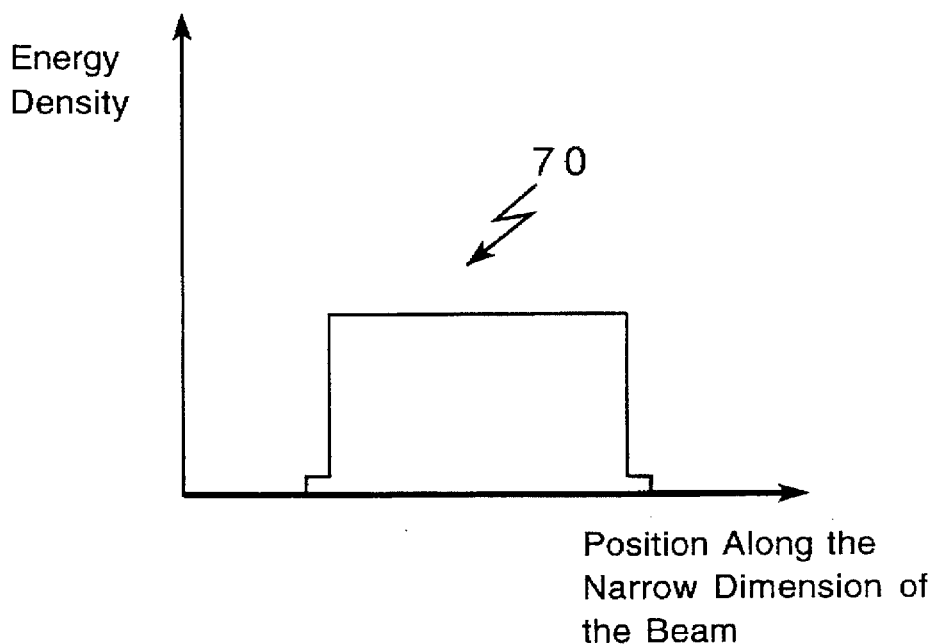

Alternatively, the energy density profile of the laser pulses may have a relatively wide leading edge 66 and a narrower trailing edge 68, as shown in FIG. 3A. It is believed that such a profile would cause the cloud of ablated foreign material to form differently than the profile shown in FIG. 3. The energy density profile may instead have a broad energy density profile 70 (FIG. 3B), with minimally differentiated leading and trailing edges.

Figure 3D:
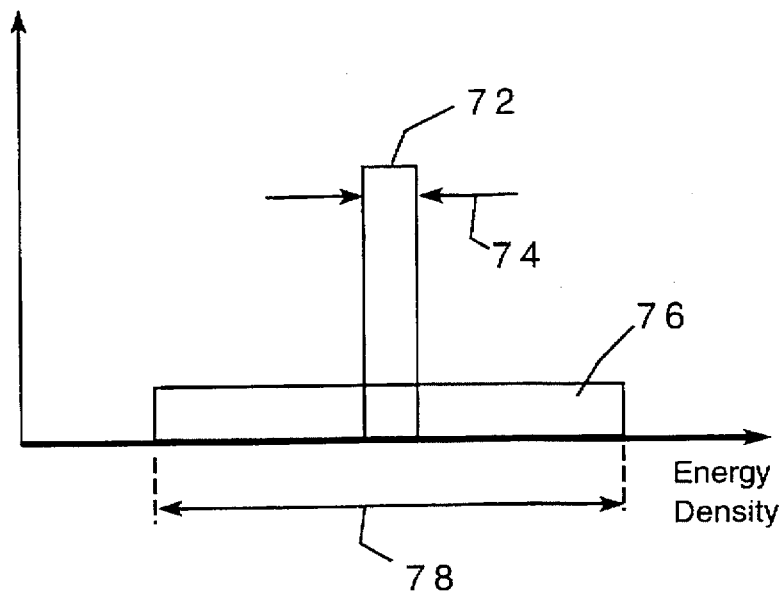
Figure 3C:
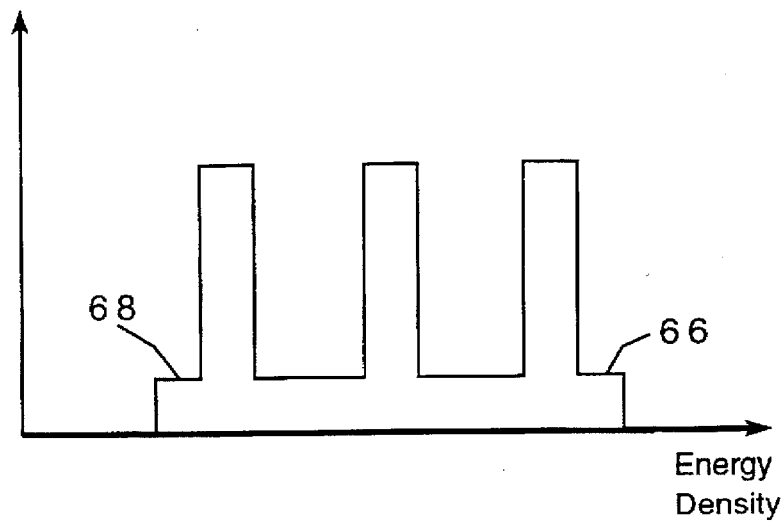

Referring to FIG. 3C, the energy density profile of the laser pulses may include a broad low energy component and two or more high energy density regions. Spaced an appropriate distance apart, these multiple high energy density regions will provide the advantages of multiple scans in a single sweep (see the discussion below in reference to FIG. 9). As shown in FIG. 3C, a high energy laser beam can be split into several (e.g., three) knife-like beams that are spaced apart by about 0.25 inch to 0.5 inch. The beam can be split by a phase grating or a beam splitter. This technique allows a large amount of laser energy to be applied to the foreign material during a single sweep, enabling efficient and high speed cleaning.

Figure 4:
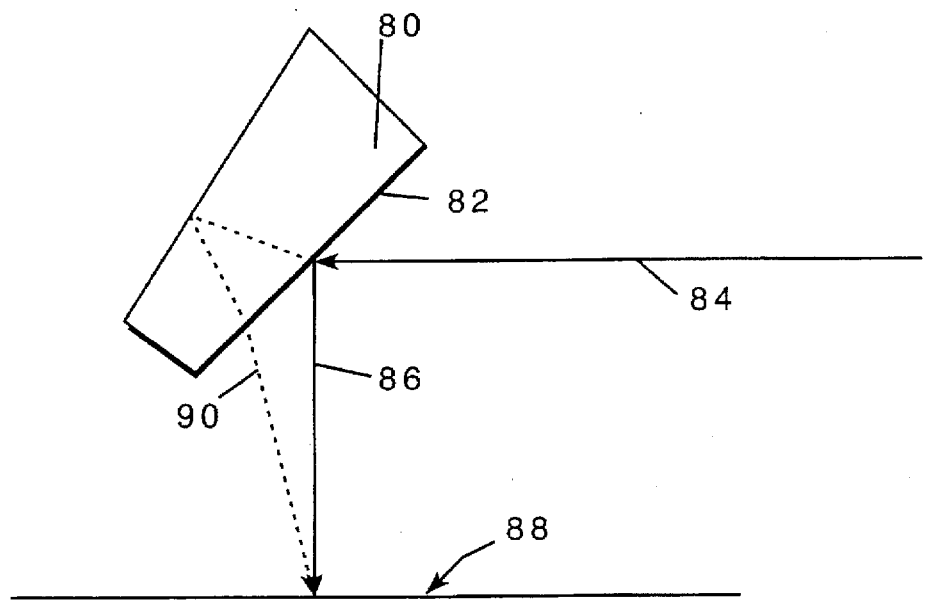
FIG. 4 is a schematic side view of a beam directing technique.

Referring to FIG. 4, a structure for forming a profiled beam includes a wedge prism 80 that has a beam-splitting surface 82 positioned in the path of an incoming light beam 84. A portion 86 of beam 84 reflects directly off of the beam-splitting surface and illuminates substrate surface 88. A second portion 90 of beam 84 also illuminates the substrate surface after undergoing internal reflection within the prism. The prism and the substrate surface are arranged so that one of the beam portions 86, 90 is focused on the surface as a narrow elongated beam, while the other beam portion is delivered to the surface as a wider, unfocused, elongated beam.

Wavelength Distribution

The profiles of FIGS. 3, 3A, 3B and 3C may be formed using monochromatic light. For example, the energy density profile of FIG. 3B may be formed, e.g., by homogenizing excimer laser pulses that have Gaussian energy density profiles.

Alternatively, such profiles may be formed by a superposition of light beams of different wavelengths, which each having a preselected energy density profile. Referring to FIG. 3D, an elongated ablation beam can be formed from a focussed beam of radiation 72 that has a wavelength 266 nm and a width 74 of 100 μm, along the narrow dimension of the beam, superimposed with a beam 76 that has a wavelength of 355 nm and a width 78 of 10 mm.

Multiple-wavelength energy density profiles could be formed by superimposing light from two separate sources. In these schemes, laser pulses (e.g., having a wavelength of 248 nm or 193 nm) from a laser source would be focused onto the wafer surface to provide the narrow high energy density portion 72 of the illuminating radiation, and light from a lamp (e.g., a UV floodlamp), or a second laser source, would provide the broad, low-energy density portion 76 of the illuminating radiation. The wavelength of the high energy density pulses would be selected to optimize ablation of the foreign material, while the wavelength of the low energy density light could be selected to excite the reactive species of the input gas into a more reactive species or preexcite the foreign material. A focused light beam from a UV floodlamp, which produces relatively high energy density light at wavelengths below 200 nm, could be used to generate highly reactive ozone from an oxygen atmosphere to enhance the photoreactive process.

In another possible embodiment, multiple-wavelength energy density profiles may be formed from a single high power laser source, e.g., a Nd:YAG laser in combination with frequency-multiplying optics, which provides radiation at wavelengths of 532 nm, 355 nm, 266 nm, and 1064 nm, at energy densities sufficient for ablation. Thus, beam pulses at each wavelength would be selectively delivered to the wafer surface. For example, the 266 nm beam could be focused onto the surface to form the high energy density region 72 and the longer wavelength beams would form the broad lower energy density region 76 of the composite beam.

Acoustic Pulses

Figure 5:
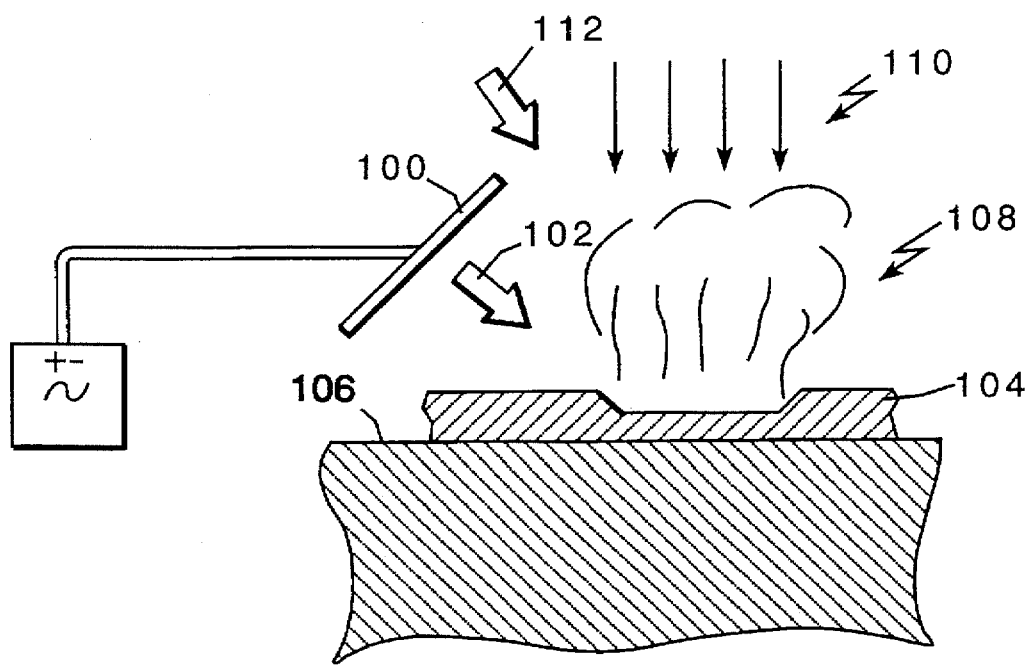
FIGS. 5, 6 and 6A are schematic side views of cleaning schemes.

An acoustic transducer 100 (FIG. 5) may be included in the system to deliver acoustic pulses 102 to foreign material 104 on a substrate surface 106 at a high frequency. The ultrasonic frequencies which would be used in surface cleaning preferably lie in the range of 30 kHz to 75 kHz, and more preferably between 40 kHz and 55 kHz. It is believed that the high frequency pulses help to remove submicron particles from the wafer surface either by direct transfer of acoustic energy to the foreign material or by favorably enhancing other surface cleaning phenomena. The transducer may be adapted to provide an energy pulse to a cloud 108 of ablation components at times that are coordinated with the delivery of laser pulses 110 to help promote the reaction between the ablated components in cloud 108 and the reactive species of input gas 112. The use of such high frequency acoustic pulses provides athermal energy that can complement other forms of energy delivered to the surface or to cloud 108.

As mentioned above, the entire wafer may be submerged in a liquid which would serve the purpose of efficiently transmitting the acoustic pulses to the region of a cloud of ablation components while reactive species are delivered, in liquid form, to the submerged cloud.

Plasma Discharge

Figure 6:
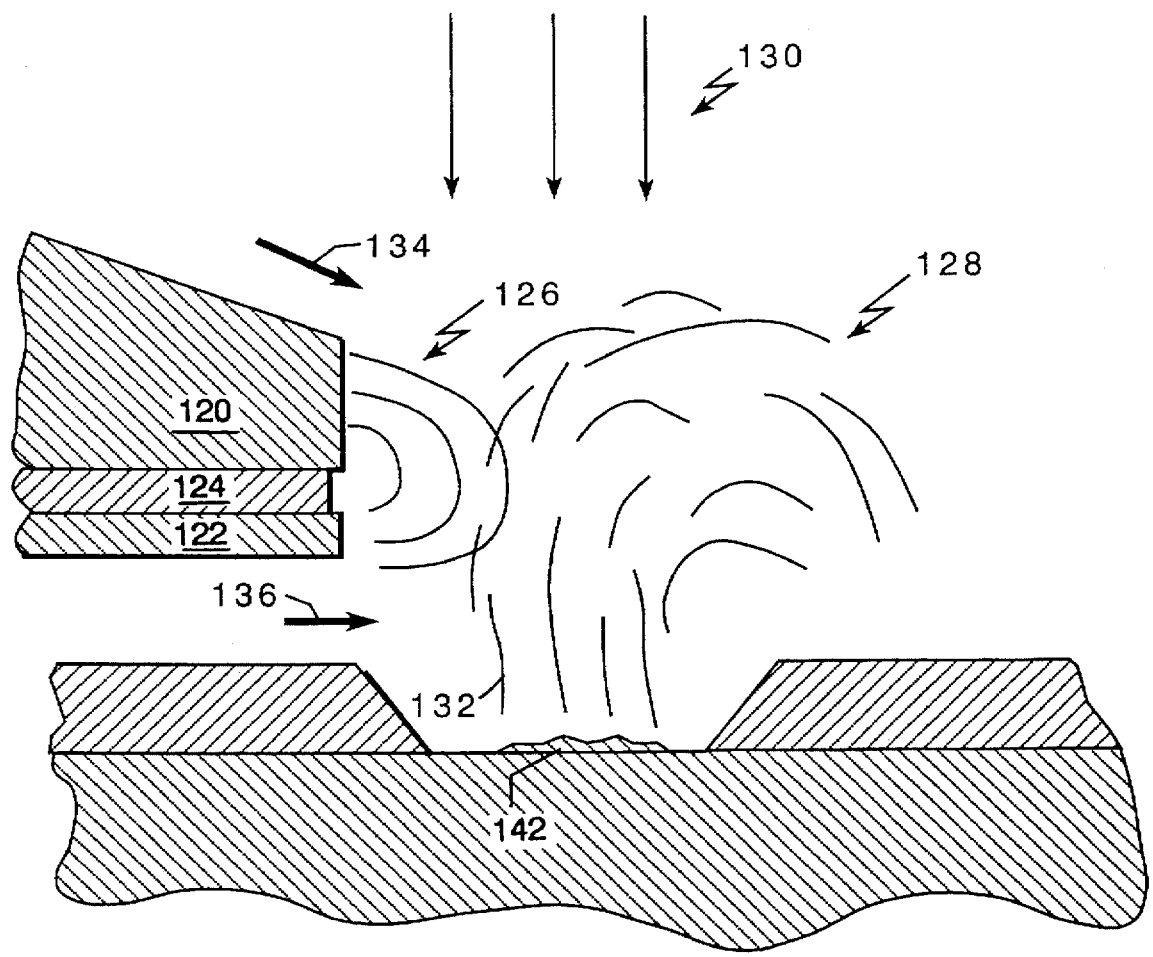
Figure 6A:
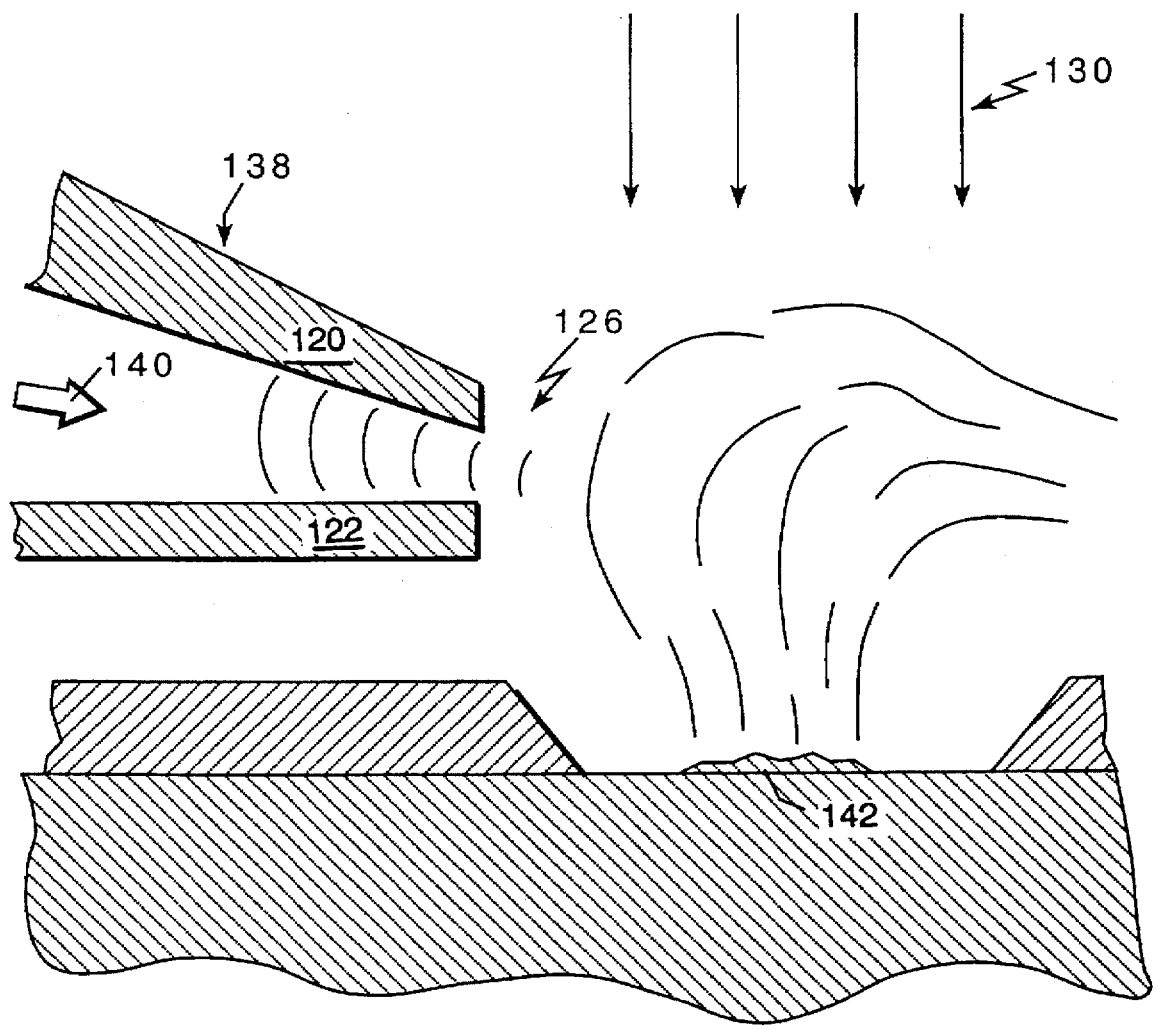

Referring to FIG. 6, electrodes 120, 122, which are separated by an insulator 124, may be used to provide a plasma discharge 126 in the vicinity of the cloud 128 (also called the "reaction zone") to promote the reaction of the ablation components with the reactive species in the input gas. The plasma discharge can be continuous or pulsed. The pulsed discharge can be triggered by the delivery of a laser pulse 130 or by the presence of ablated foreign material 132 between the electrodes. Input gas 134, 136 can be delivered above and/or below the discharge source, as shown. Alternatively, as shown in FIG. 6A, electrodes 120, 122 may form part of a gas delivery nozzle 138 to pre-excite input gas 140 and thereby greatly increase the concentration of reactive gas species in the input gas delivered to cloud 128. The excited reactive gas species produced by the discharge may be further excited by the laser pulses 130 delivered to foreign material 142.

Input Energy Delivery

In addition to selecting the optimal form of the energy to be delivered to the surface (e.g., laser pulses possibly augmented by acoustic pulses and/or plasma discharge), proper delivery of the energy to the surface has been observed to greatly improve the cleaning results.

Angle of Incidence

Delivering laser pulses at an oblique angle of incidence relative to the wafer surface enhances the cleaning effect and reduces damage to the wafer surface for a beam of a given energy level. An oblique angle of incidence also seems to aid the flow of ablation components away from the cleaned regions of the wafer (this may be due to the favorable energy density profile across the illuminated region of foreign material, the directional nature of the laser photons, or the shock waves produced by the laser pulses).

Figure 7:
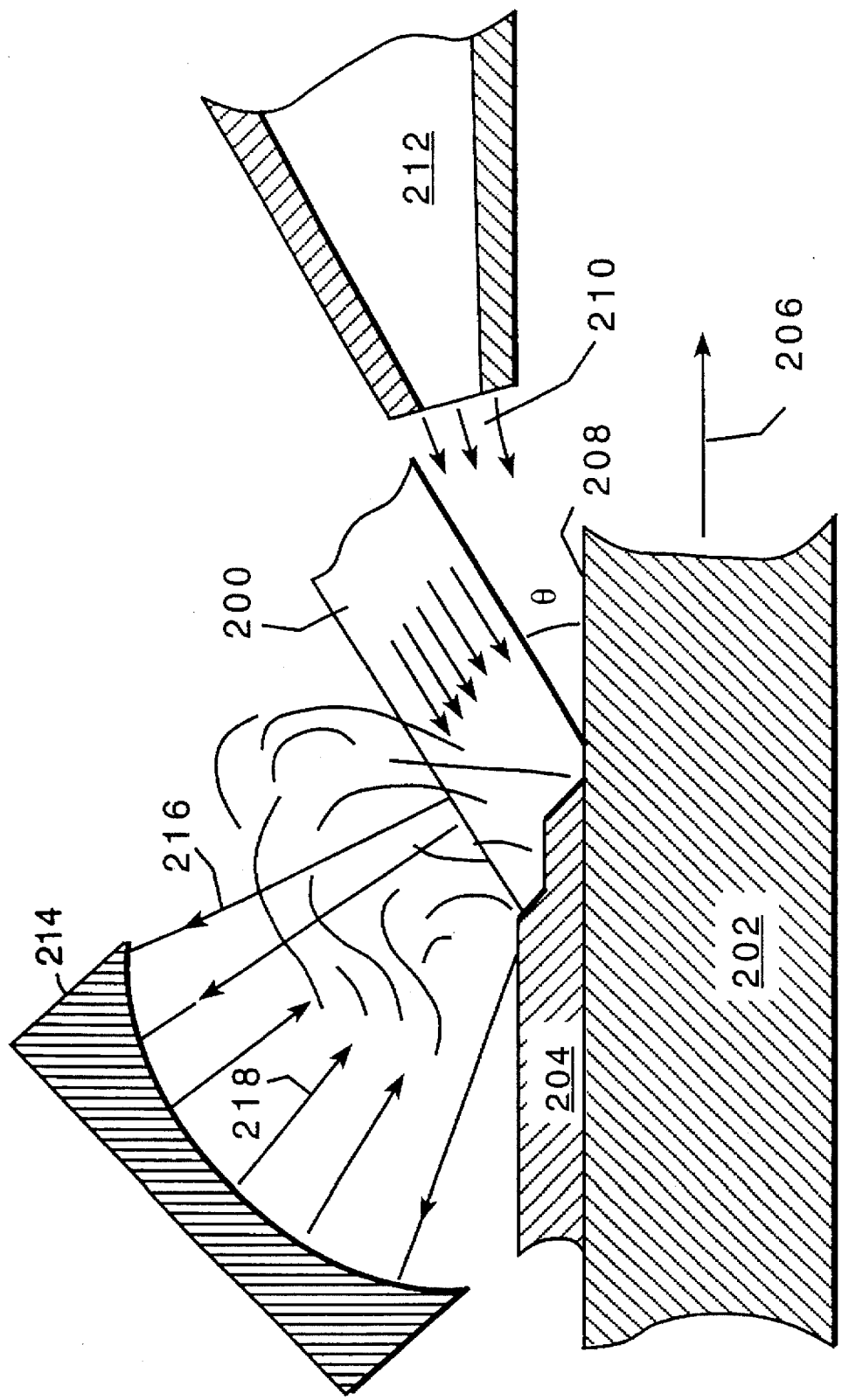
FIG. 7 is a schematic sectional side view of a substrate being cleaned.

Referring to FIG. 7, laser pulses 200 may be delivered to a substrate surface 202 at an acute angle of incidence θ relative to the surface. Good results are achieved for angles between 0° and 30°, preferably between 0° and 20°, and more preferably between 12° and 15°. In this way, a significant proportion of light energy is absorbed by a layer of foreign material 204 and only a small fraction of the light energy absorbed by the substrate surface (because, e.g., the effective depth of the layer of foreign material increases as the angle of incidence of the illuminating beam is reduced relative to the substrate surface). This allows higher energy densities to be used, and improves the cleaning results without damaging the substrate surface.

One important advantage of using a beam delivered at an oblique angle of incidence is to preferentially ablate the side walls of patterned foreign material features. This is especially advantageous for those situations in which the top surface of the foreign material is more difficult to ablate than the side walls. This advantage may also be realized when removing unpatterned foreign material with an angled beam because side wall-like features are typically created during the removal process. As removal proceeds, the ablation surface of foreign material adopts a contour that is perpendicular to the incoming angled beam (not parallel to the surface of the foreign material) so that it receives the full energy density of the beam, while the surface of the wafer receives a much lower effective energy density, determinable by the geometry.

Preferably the substrate is moved in the direction of arrow 206 so that the cloud of ablated foreign material is directed away from previously cleaned regions 208.

Figure 8:
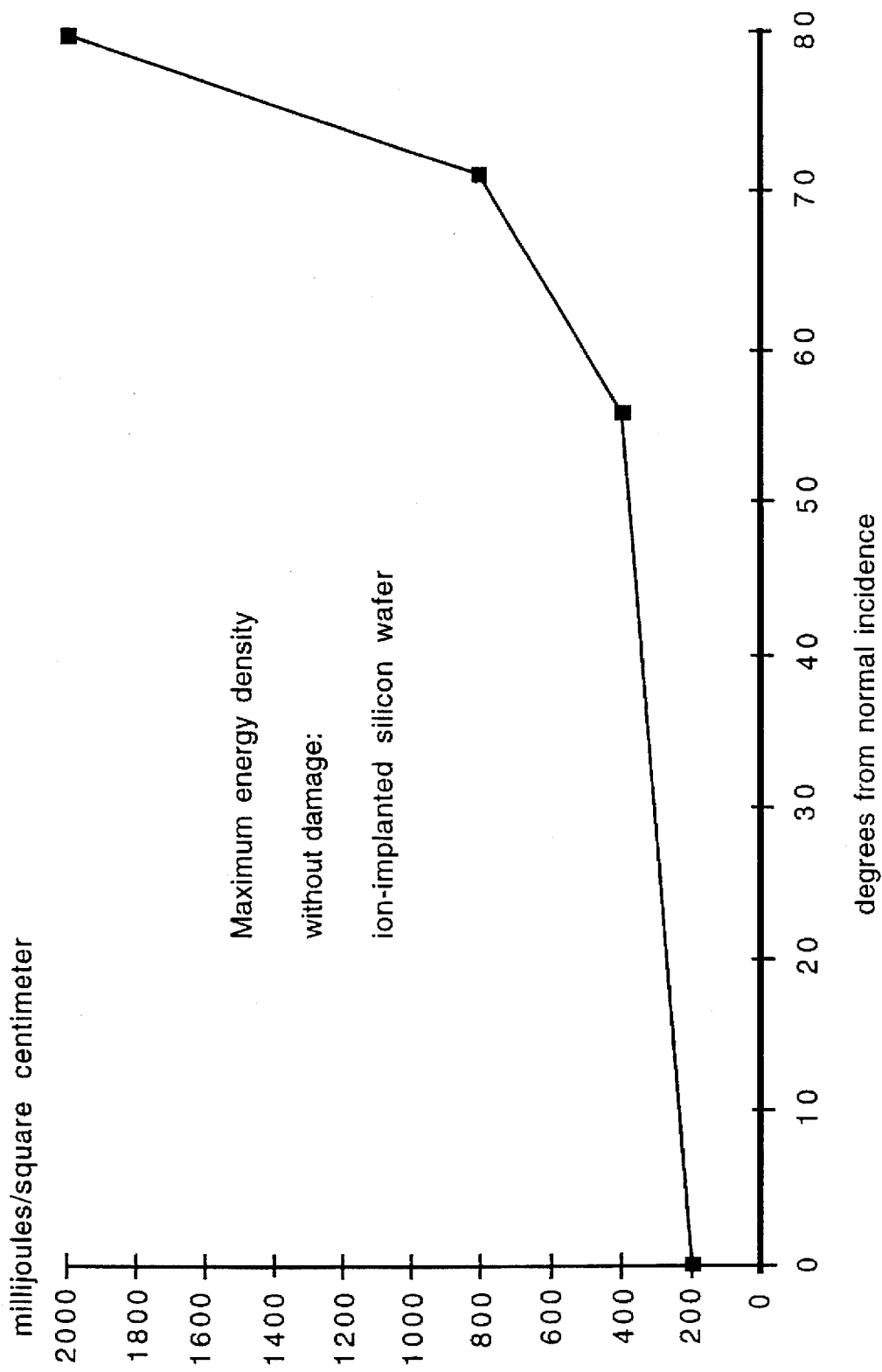
FIG. 8 is a plot of maximum energy density as a function of beam angle.

As shown in FIG. 8, energy densities up to 2000 mJ/cm$^2$ can be used at angles of about 80° from normal incidence (i.e., 10° relative to the substrate surface). In this way, a much larger portion of the input energy can be directed at the foreign material and less energy is received by the substrate. Higher energy densities are useful for some particularly difficult cleaning tasks, such as the removal of vertical-standing flakes of ion-implanted photoresist which strongly adhere to surfaces.

The input gas 210 may also be delivered to the wafer surface at an acute angle of incidence by a nozzle 212. A cylindrical mirror 214 may be positioned in the path of light 216 reflected from the surface of the substrate. Mirror 214 focuses and redirects light 218 back to the foreign material on the substrate surface, improving the efficiency of the procedure.

Scanning Regimes

The surface cleaning is unexpectedly more efficient if the parameters of the procedure are selected so that the laser pulses do not remove the photoresist layer in a single pass, but instead remove the photoresist in several passes.

Figure 9:
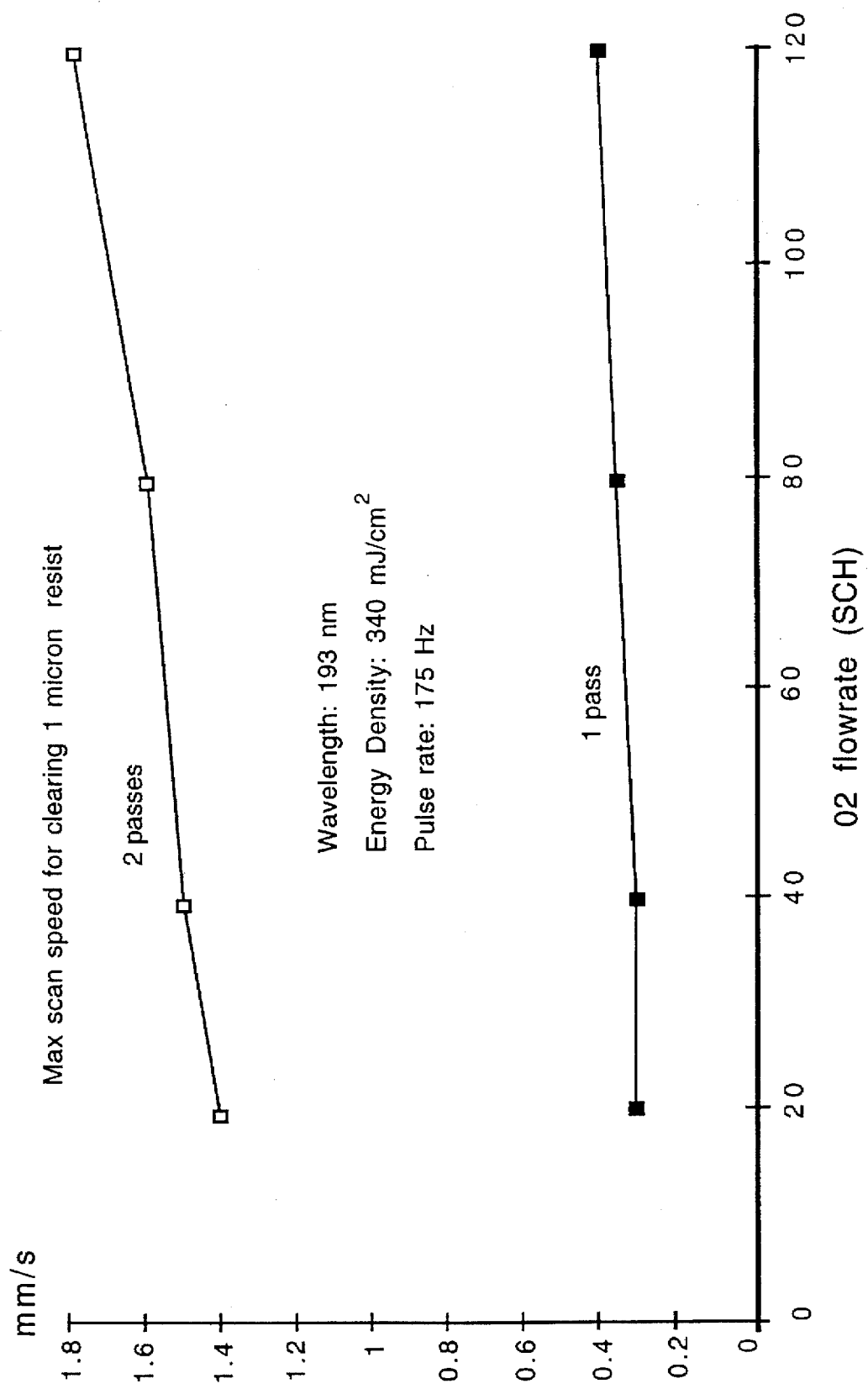
FIG. 9 is a plot of the maximum wafer scan rates.

Referring to FIG. 9, using elongated laser pulses that have a wavelength of 193 nm, an energy density of about 340 mJ/cm$^2$, and a pulse rate of 175 Hz, the maximum scan rate for clearing 1 μm-thick ion-implanted photoresist from a wafer surface in a single pass is about 0.4 mm/sec, while the maximum scan rate for clearing 1 μm of photoresist in two passes is about 1.6 mm/sec (about twice the removal rate as the single-pass scan). These values are relatively constant for an oxygen flow rate between 20–120 SCFH (standard cubic feet per hour). One possible explanation is that the reactive species in the input gas do not become depleted at higher scan speeds, because a smaller cloud of ablation components is formed (which can be easily reacted with and removed by the applied flow of input gas).

There are a number of possible scanning methods. Two simple schemes are rastering a rectangular beam over a substrate (i.e., moving the beam or substrate while pulsing the laser so that a 2-dimensional array of illuminated regions is produced) and scanning an elongated beam across the wafer in one direction (unidirectional scanning). Unidirectional scanning may often be preferred because it is mechanically simpler to implement.

The total cross sectional area of the applied pulses is determined by the output energy per pulse of the laser which is used. For example, to maintain an energy density of 200 mJ/cm$^2$ at a surface using laser pulses of 40 mJ, the beam area should be 0.2 cm$^2$ at the surface. Unidirectional scanning of an elongated beam over a 20 cm (8 inch) diameter substrate requires a beam width along the narrow dimension of 0.1 mm. Assuming laser pulses of 2 Joules per pulse are used, the maximum beam area should be 5 cm$^2$ to achieve an energy density of 200 mJ/cm$^2$. Unidirectional scanning of a 2.5 cm (1 inch) wide substrate could be performed with a beam having dimensions of 2.5 cm×2 cm, or nearly square. On the other hand, for the same energy density, a 4 inch diameter substrate would require a 5 mm wide beam, and an 8 inch diameter substrate would require a 0.5 mm wide beam. Higher energy beams would allow wider beams which provide larger areas of illumination or higher energy densities over smaller areas, increasing the overall cleaning rate.

There are several other possible scanning methods, some of which are described below.

Figure 10:
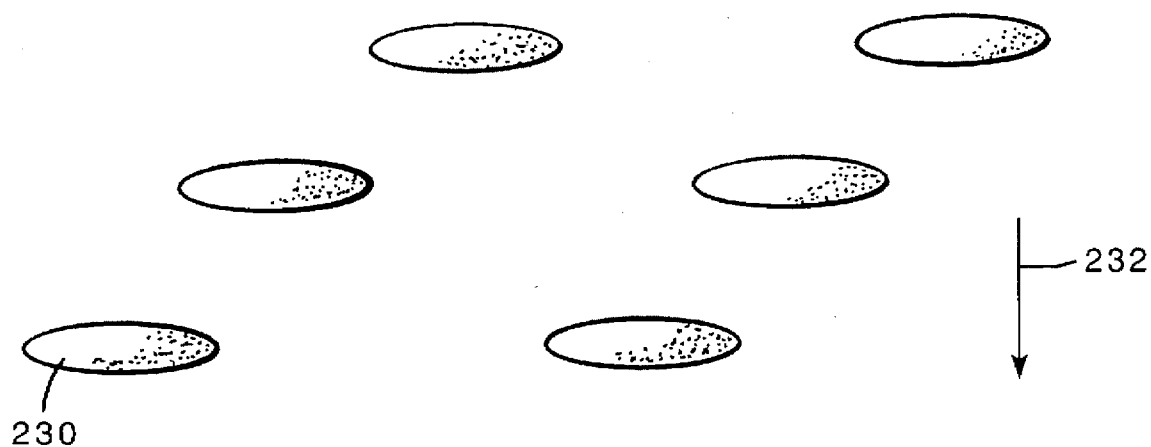
FIG. 10 is a schematic top view of wafer regions illuminated by an array of laser beams.

In certain applications, it is desirable to separately illuminate a number of discrete small regions on the substrate surface rather than a single large region. For example, when performing material removal on a surface, it may be desirable to generate a series of spaced-apart illumination regions across the substrate surface for efficient utilization of the reactive gas species and other components in the input gas. As shown in FIG. 10, instead of an elongated knife-like blade of radiation, the beam could be divided into an array of laterally displaced beams, each slightly oval in form, which would illuminate the substrate surface over the array of regions 230. The laterally displaced beams would be arranged so that after a substrate has passed through the beams in the scan direction 232 the entire surface of the substrate would have been exposed to the laser energy.

Figure 10A:
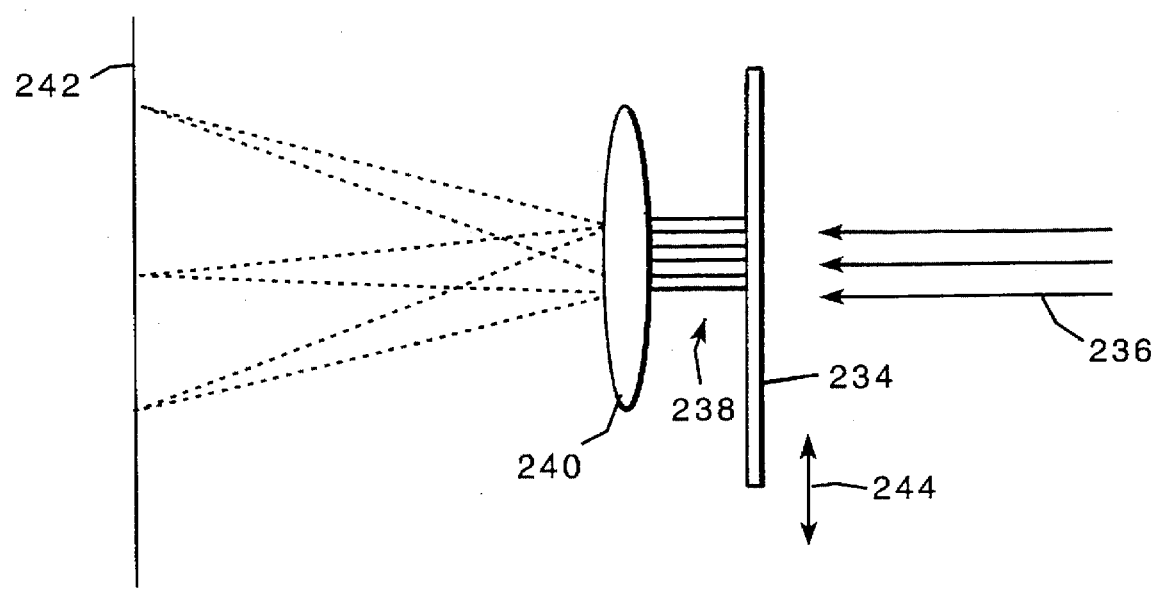
FIG. 10A is a schematic side view of an optical system for producing an array of illuminated regions.

Referring to FIG. 10A, the array of beams shown in FIG. 10 may be generated by a binary phase grating reticle 234 (e.g., an electron-beam fabricated phase-shifting mask) positioned in the path of an incoming beam 236 to form an array of beams 238. A spherical focusing lens 240 focuses beams 238 at their respective locations in the array on substrate surface 242. A cylindrical optical component (not shown) is used to make the spots elliptical or oval, as shown in FIG. 10. The number of spots selected depends on the amount of laser energy available and the spot size at the surface. The array of regions 230 may be scanned across the wafer by moving the wafer relative to the optics. If the array repeats itself along the scan direction, the scan travel distance may be reduced (so long as the entire wafer surface is illuminated after one scan pass). Alternatively, the binary phase grating may be passed back and forth through the beam in direction 244 to provide any desired sequence of spot patterns over the surface of the substrate.

If grating 234 includes a one-dimensional pattern, then a set of blade-like beams is formed on the surface of the foreign material resulting in the energy density profile shown in FIG. 3D, which provides the above-mentioned advantages of multiple scans except in a single sweep.

Figure 10B:
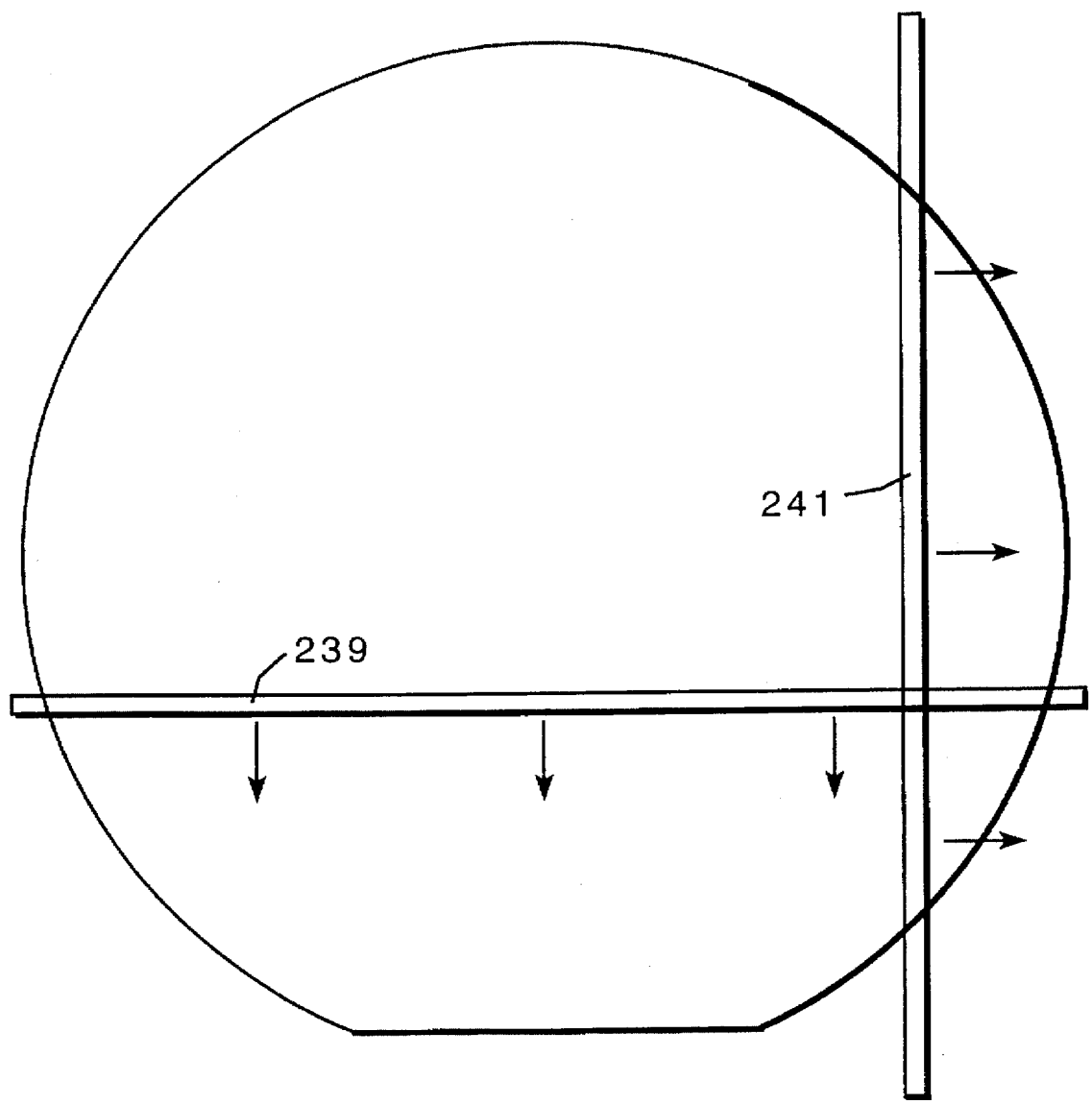
FIG. 10B is a schematic top view of a surface cleaning scheme.

Referring to FIG. 10B, when removing patterned ion-implanted photoresist from a silicon wafer, the use of an angled beam is effective in removing the compacted vertical-standing photoresist at the feature edges. However, it has been observed that this is preferentially more effective for features facing the beam at right angles. In order to optimally remove all of the compacted feature edges, it is useful to perform two sets of scans with the angled beam, the laser optics or the wafer may be rotated 90 degrees to produce first 239 and second 241 transverse sets of scans.

Input Gas

The choice of input gas used in surface cleaning is guided by the type of foreign material to be removed or other surface modification desired. The input gas may include reactive species, inert species, diluents, and inducer gases.

Reactive Gas Species

Examples of proposed foreign material/reactive gas combinations are provided below.

EXAMPLE 1

For the removal of organic contaminants, such as dust (comprising carbon, hydrogen, nitrogen, oxygen, trace metals and trace oxides), polymer residues (comprising fluorinated and chlorinated carbon-based molecules), photoresist monolayers (comprising carbon, hydrogen, nitrogen, sulfur, and trace concentrations of iron, sodium and other trace metals), polymers, polyimide, polyamide, and ion-implanted photoresist the following photoreactive cleaning step would be performed:

(1) use ultra-violet (UV) laser pulses with a wavelength of 248 nm in combination with oxygen gas to remove the initial organic contaminant layer—$UV(\text{light}) + O_2 + C \rightarrow CO(\text{gas}) + CO_2(\text{gas})$ $UV(\text{light}) + \{H, N, S\} + O_2 \rightarrow \{H_2O, NO_2, SO_2\}(\text{gas})$.

EXAMPLE 2

The initial organic cleaning step (example 1) usually causes the oxidation of aluminum metal layers according to:

$$4Al + 3O_2 \rightarrow 2Al_2O_3.$$

The following gases may be employed to remove native aluminum oxide:

(1) UV laser pulses with chlorine gas—$UV(\text{light}) + 2Al_2O_3 + 6Cl_2 \rightarrow 4AlCl_3(\text{gas}) + 3O_2(\text{gas})$;

(2) UV laser pulses with boron chloride gas—$UV(\text{light}) + Al_2O_3 + BCl_3 \rightarrow 2AlCl_3(\text{gas}) + B_2O_3(\text{gas})$.

EXAMPLE 3

The initial organic cleaning step (example 1) usually causes the oxidation of the silicon substrate according to:

$$Si + O_2 \rightarrow SiO_2.$$

To remove silicon oxide films the following gases may be used with UV laser pulses:

(1) $UV(\text{light}) + 3SiO_2 + O_2 + 2C_2F_6 \rightarrow 3SiF_4(g) + 4CO_2(g)$;

(2) $UV(\text{light}) + SiO_2 + CF_4 \rightarrow SiF_4(\text{gas}) + CO_2(\text{gas})$.

EXAMPLE 4

To remove silicon films the following gases may be used in combination with UV laser pulses:

(1) $UV(\text{light}) + 3Si + 4O_2 + 2C_2F_6 \rightarrow 3SiF_4(g) + 4CO_2(g)$;

(2) $UV(\text{light}) + Si + O_2 + CF_4 \rightarrow SiF_4(\text{gas}) + CO_2(\text{gas})$.

EXAMPLE 5

To remove metal- and oxide-bearing residues chlorine gas may be used with UV laser pulses:

(1) $UV(\text{light}) + 2Al_2O_3 + 6Cl_2 \rightarrow 4AlCl_3(\text{gas}) + 3O_2(\text{gas})$;

(2) $Si + 2Cl_2 \rightarrow SiCl_4$.

The above examples are simplified to show the strategy of targeting the contaminant with the appropriate gas.

Inducer Gases

Additional gases, referred to as inducer gases, may be included in the input gas to enhance the efficiency of the reaction between the reactive gas species and the foreign material to be cleaned. The addition of inducer gases is particularly useful for removal of highly cross-linked polymer residues.

Carrier Gases

A nonreactive carrier gas such as helium may be mixed with the reactive gas such as oxygen to take advantage of the low viscosity of helium. A properly selected mixture of helium and oxygen will have a lower viscosity than pure oxygen, which will permit faster and more effective delivery of the oxygen to the cloud of ablation products.

Diluent Gases

If the gas has an appreciable absorption coefficient for the radiation used, care must be taken to insure that an adequate beam intensity reaches the substrate. As a general rule, the absorption coefficient multiplied by the length of the beam path in the gas must be less than 1. Since the beam path in most configurations will be in the range 1 cm to 10 cm, this means that the absorption coefficient of the gas or gas mixture at the operating conditions should in any case be less than $1 \text{ cm}^{-1}$.

At 248 nm wavelength, the absorption coefficient of both air and oxygen at 1 atm pressure is negligible, while that of pure ozone ($O_3$) is approximately $300 \text{ cm}^{-1}$. The absorption coefficient of a gaseous ambient is proportional to the density of the absorbing species: when using ozone, for example, acceptable beam transmission can be obtained by diluting it to 0.01% by volume (in air, oxygen, or an inert gas such as helium or argon), or by reducing the pressure to 0.0001 atmosphere, or by some combination of dilution and reduced pressure.

Diluent gases may be used to increase the mean free path of the excited species (e.g., $N_2O \rightarrow N_2 + O$), before recombination, allowing more of the reactive species to reach the surface.

Input Gas Delivery

Figure 11:
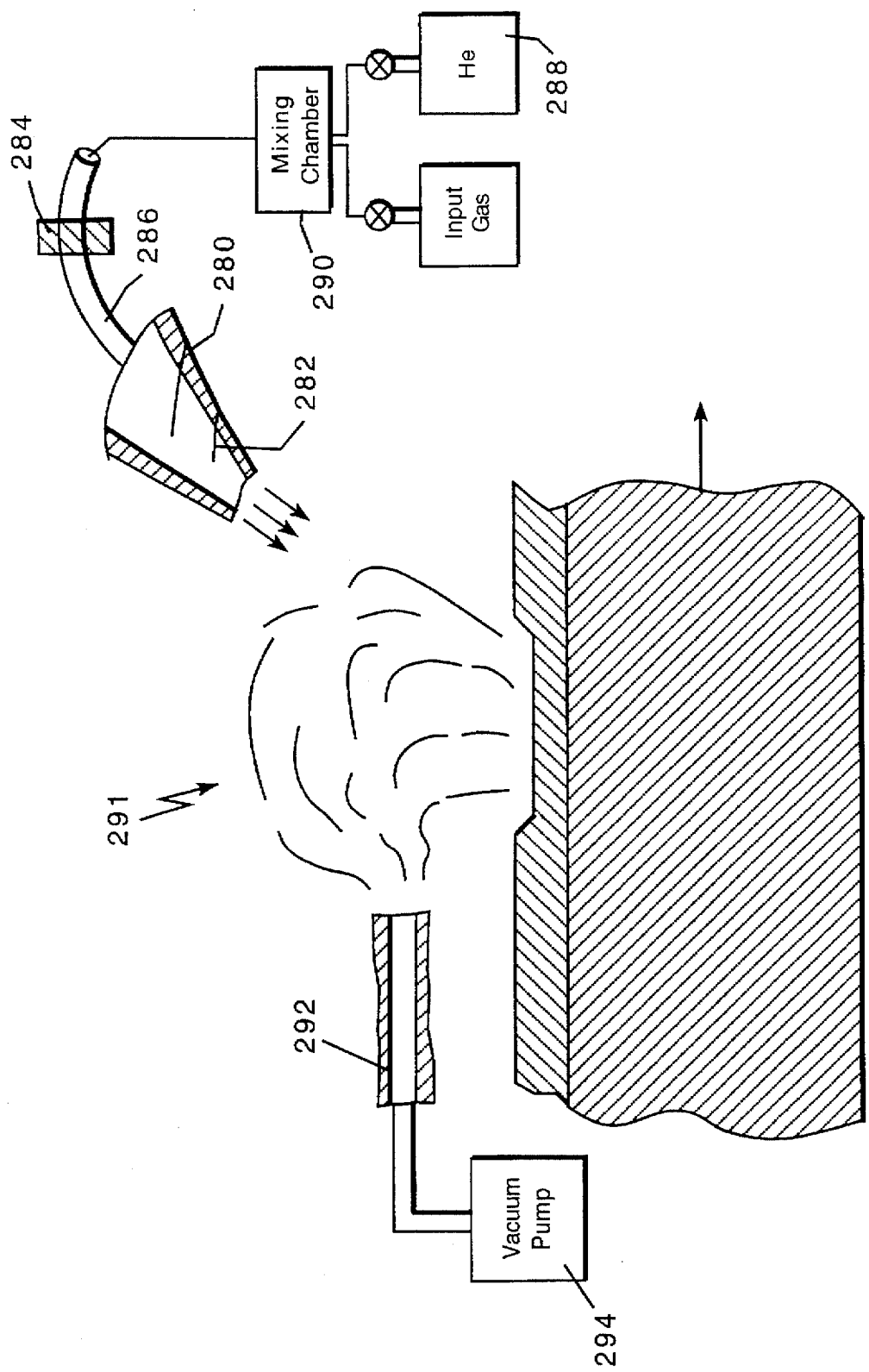
FIG. 11 is schematic side view of a cleaning scheme.

Referring to FIG. 11, in one embodiment, the input gas is delivered to the cloud 291 of ablation components above the wafer surface. This enhances the reaction between the ablation components of the foreign material in the cloud and the reactive gas species in the input gas. The input gas is delivered through a nozzle 280 with either a rectangular or circular orifice at an angle between 10° and 45° relative to the substrate surface. The nozzle may include baffles 282 to create a turbulent flow of the gas to the reaction cloud.

Surface cleaning is significantly improved if the input gas is delivered to the cloud of ablation components at a high velocity. We believe higher gas velocities provide a higher concentration of reactive gas species to the cloud of ablation components, which increases the number of ablation components that react with the delivered reactive gas species. Good results have been achieved using input gas flows of 10–100 SCFH from a 0.1 inch wide by 8 inch long orifice, positioned 0.2 inches above the substrate surface. The gas is delivered at a velocity preferably between 50 mm/sec and 20,000 mm/sec, more preferably between 100 mm/sec and 10,000 mm/sec, and most preferably between 200 mm/sec and 5,000 mm/sec.

The gas could be delivered continuously or as a series of intermittent pulses synchronized with the delivery of the pulses of laser radiation, which reduces gas usage. The pressure inside the cleaning system may be reduced to about 0.1 atm to maximize the velocity of the input gas. A heater 284 may be coupled to gas conduits 286 (alternatively, heater 284 is coupled to the nozzle) to preheat the reactive gas to a temperature between 30° C. and 300° C. to increase the rate of reaction between the ablation components and the reactive gas species in the input gas. Heating the input gas also compensates for the isenthalpic cooling resulting from expansion of the gas as it leaves the nozzle.

Figure 11A:
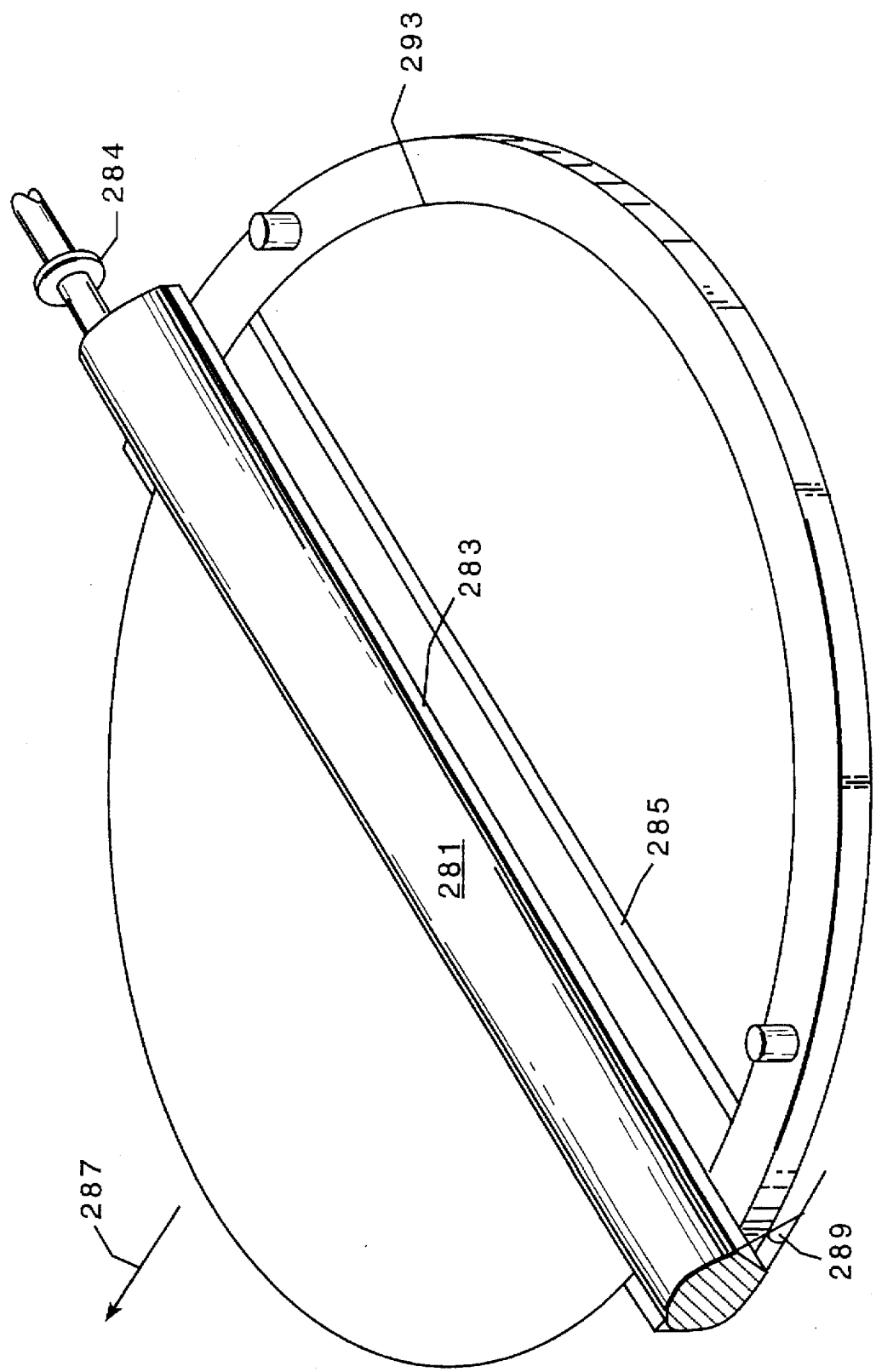
FIG. 11A is a perspective view of a gas delivery system.

Referring to FIG. 11A, a rectangular nozzle 281 has an elongated rectangular slot 283 which can direct an input gas onto a substrate 293 with a relatively uniform pressure of 1–90 psi horizontally across an UV illuminated region 285 of the surface. Slot 283 is positioned about 2–5 mm above the surface of the wafer and about 1–10 mm in front of (in the direction indicated by arrow 287) the reaction zone and is aimed at an angle 289 of between 10 and 45 degrees, measured from the plane of the wafer. A heating element may be provided at the end of nozzle 281, or at a valve 291, to adjust the temperature of the input gas. The width of slot 283 of nozzle 281 can be made adjustable to optimize the gas flow rate for particular foreign materials to be cleaned away.

Gas Removal

An exhaust nozzle 292 (FIG. 11) coupled to a vacuum pump 294 provides a high velocity exhaust near the cloud of ablated foreign material to evacuate the reacted and unreacted ablation components in the cloud 291. The exhaust gas can be filtered, processed and reconstituted to reduce processing costs. Also, the input and exhaust gas parameters may be selected to develop a gas flow capable of entraining the components of the cloud of reacted and unreacted ablated foreign material away from the vicinity of the substrate.

Submerged Reactions

Figure 12:
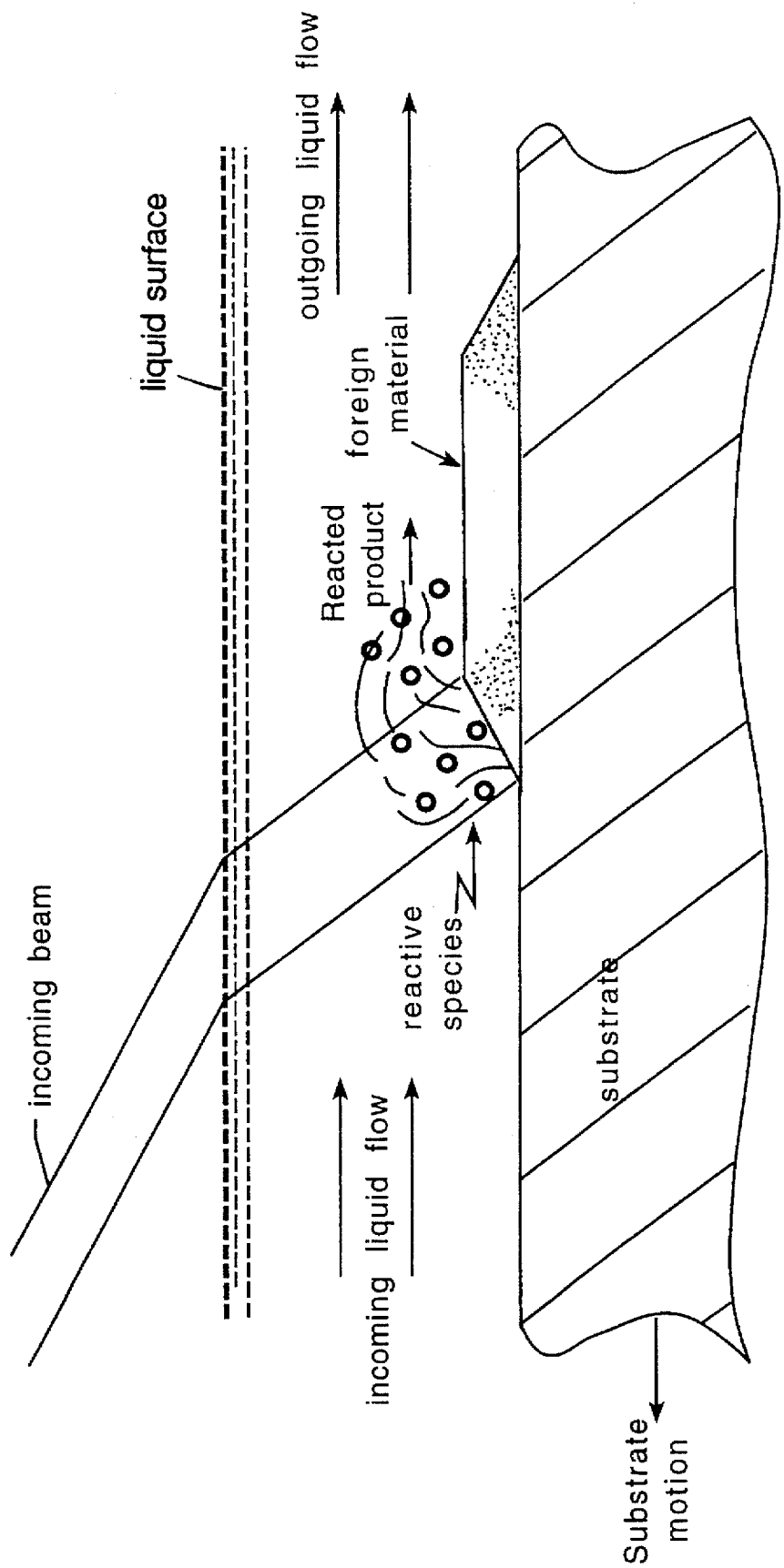
FIG. 12 is a schematic side view of a surface cleaning scheme.

Referring to FIG. 12, in another embodiment, the surface to be cleaned is immersed in a liquid solution which includes a reactive species. The beam is transmitted through the liquid to the surface to be cleaned (at a normal or oblique angle of incidence). The input beam provides localized heating of the surface and, in the case of organic foreign materials, causes the same type of ablation cloud to form. The input beam also excites reactive species in the liquid solution.

Using a liquid medium for the reaction may be preferable to using an input gas to clean foreign materials that are not easily ablated at beam energies below the damage threshold of the substrate, or with foreign materials that are prone to recondense on the substrate in gaseous atmospheres. The liquid may be static, turbulent or may be flowing laminarly. In those embodiments in which the liquid flows, the liquid preferably flows at a velocity between 0.2 mm/sec and 2,000 mm/sec, more preferably between 0.5 mm/sec and 1,000 mm/sec, and most preferably between 1 mm/sec and 500 mm/sec. The liquid may also be filtered and replenished during the processing. The flowing liquid may also be non-reactive.

In one example, a residue on a silicon wafer remaining after stripping ion-implanted photoresist was removed by scanning a 248 nm wavelength excimer laser beam over the residue while the wafer was immersed in an oxidizing solution (approximately 0.3% concentration of hydrogen peroxide in deionized water) at a temperature between 150 and 200 degrees Fahrenheit, and a depth of 5 to 10 millimeters. The beam energy required for this process was 20 mJ/cm$^2$, and the beam cross section was 1 cm×4 cm.

Additives can be included to enhance the action of the oxidizing solution. For example, stripping of organic residue by a hydrogen peroxide solution may be accelerated by the addition of a wetting agent such as polyethylene glycol p-tert-octylphenyl ether (Triton X-100), or an alkali such as potassium hydroxide or trisodium phosphate. For example, the stripping action of a 0.15% solution of hydrogen peroxide in deionized water was found to be significantly accelerated by the addition of an approximately 1% concentration of trisodium phosphate. For cleaning silicon wafers, metal ion free alkalis such as ammonium hydroxide or tetramethylammonium hydroxide are preferred.

Absorption Coefficient and Depth of Liquid Solution

When performing laser surface cleaning on a substrate in a liquid solution, the UV light absorption coefficient of the solution is a very important factor in the process. In a solution consisting of a UV-absorbing solute (such as $H_2O_2$ at 248 nm) in a non-UV-absorbing solvent (such as deionized water at 248 nm), the absorption coefficient is proportional to the concentration of the solute. For example, a 0.15% solution of $H_2O_2$ in water has an absorption coefficient of 2.6 cm$^{-1}$ at 248 nm. The interaction of the laser beam with the liquid solution can generate high concentrations of reactive species (for example, $H_2O_2 \rightarrow 2OH$) along the beam path. This interaction can also produce heating and excitation of the foreign material to accelerate the reaction of the foreign material with the solution, both with species originally present in the solution and with those generated by the beam.

For a given depth of the substrate in the solution, there is a conflict between the desire to maximize the beam intensity reaching the foreign material (which demands the smallest possible absorption coefficient, and therefore, concentration of absorbing component) and the need to generate reactive species in the solution (which demands a high concentration, therefore a high absorption coefficient). There are some guidelines, however, which can help to define a suitable concentration. For example, for a given fixed depth of solution, the density of excited species produced is maximized if the concentration of the absorbing species is adjusted so that (absorption coefficient)×(depth)=1. Having a concentration greater than this amount will detract from both the heating of foreign material and the production of excited species at the substrate depth.

By minimizing the depth of the substrate in solution, we should obtain an optimal combination of heating of the foreign material and production of excited chemical species in the solution. The limits on the shallowness of the solution are practical ones imposed by surface tension of the liquid on the substrate and the need to avoid beam-induced boiling. A controllable shallow depth of solution can be obtained by flowing the liquid over the substrate and/or by adding a wetting agent to the solution. The useful liquid depths for submerged cleaning lie in the range 0.5 mm to 20 mm, and useful flow velocities range from 0.1 mm/sec to 50 mm/sec. Preferably, the liquid flow is delivered at an angle of 0°–5° relative to the surface of the substrate. A flowing solution is also useful for delivering a continuous supply of fresh solution to the reaction area. This is important because the solution may "bleach" with sustained exposure to the beam as absorbing species are depleted. This phenomenon has been observed with several solutes, such as $H_2O_2$ and KOH.

As shown in FIG. 12, if an angled beam is used, the beam will be refracted at the liquid/air interface and the angle of the beam striking the substrate is the refracted angle, calculated according to Snell's law, and dependent upon the refractive index of the liquid at the beam wavelength. The intensity of the beam reaching the foreign material must be calculated on the basis of the length of the actual beam path in the liquid, rather than the depth of the foreign material below the surface. The increased path length relative to a vertical beam may make it necessary to reduce the concentration of absorbing species in the solution. However, with an angled beam the reactive species produced along the beam path in the solution are much more "available" to participate in the reaction, since they are produced upstream from the reaction area, at a reduced height above the substrate.

Reaction Conditions

Prior to cleaning, a substrate may be pretreated using one or more pretreatment techniques that facilitate the removal of foreign material from the substrate surface.

Resist Pretreatment

In the case of ion-implanted photoresist, the photoresist can be preheated or exposed to UV light from a UV floodlamp to further compact the photoresist underneath the top ion-implanted layer. The pretreatment would cause cross-linking of the underlying photoresist layers and would drive out solvents within the photoresist. This reduces the blistering of photoresist during the laser cleaning process. The blistering tends to increase the volume of particulates formed and redeposited on the surface. The pretreatment appears to reduce explosive heating of the photoresist that would create flakes and particles from the compacted top layer. The pretreatment enables the top layer and the underlying photoresist layer to ablate at the same rate, thus achieving a desired stripping of the photoresist from top to bottom.

The photoresist layer could also be dyed with a UV light absorbing compound (for example, dyes such as Rhodamine 6G, Rhodamine 100, and IR232, available from Lambda-Physik GMBH, Gottingen Germany) following development of the photoresist, preferably before ion implantation. Alternatively, the dye can be employed in the original formulation of the photoresist. This kind of pretreatment promotes top down photoresist removal by avoiding blistering.

Figure 13:
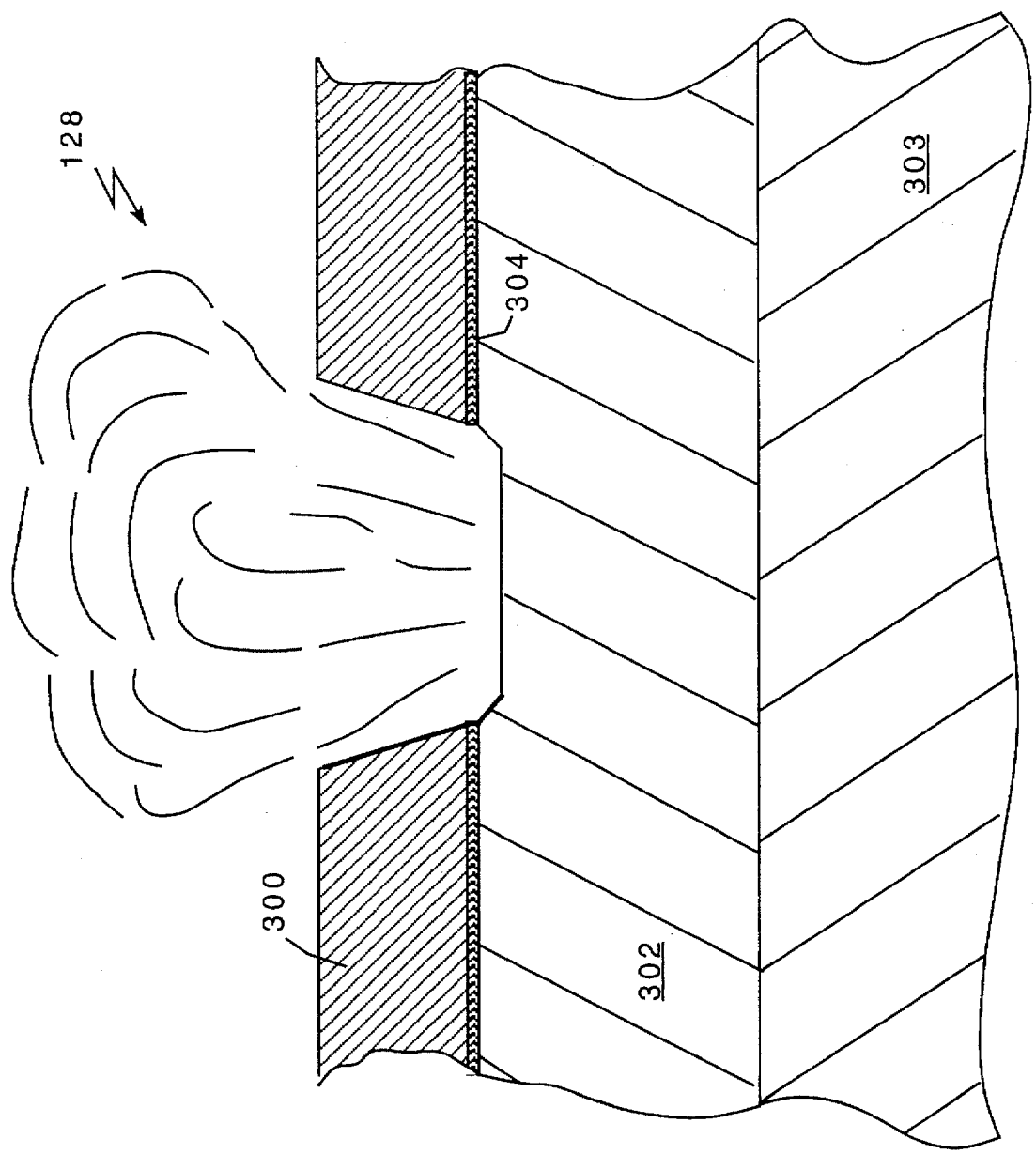
FIG. 13 is a schematic side view of a wafer with an ion-implanted photoresist layer.

Referring to FIG. 13, in another scheme for pretreating ion-implanted photoresist, an over-layer of photoresist 300 (e.g., Shipley AZ1400 although other organic films may be used) is applied on top of ion-implanted photoresist 302 on the surface of a substrate 303. This kind of pretreatment appears to reduce particle formation during surface cleaning. We believe that by initiating breakup of the compacted layer 304, ablation of the over-layer generates relatively small particles which tend to react more completely with the reactive gas species and thus tend not to redeposit on the substrate surface.

In another pretreatment scheme, the photoresist layer can be soaked in a mild alkaline solution (e.g., developer for positive photoresist or ammonium hydroxide) or exposed to a gas (e.g., ammonia) which aids the removal process.

Substrate Heating

The substrate may be heated by a heating element to raise the temperature of the substrate to about 150° C. to 200° C. It has been observed that by raising the temperature of the substrate, the removal rate of photoresist is significantly increased. It has also been observed that if the wafer is heated, the energy density of the illuminating pulses required for ablation can be reduced without compromising cleaning efficiency, which further reduces the possibility of damage to the wafer.

Catalytic Surface

Figure 14:
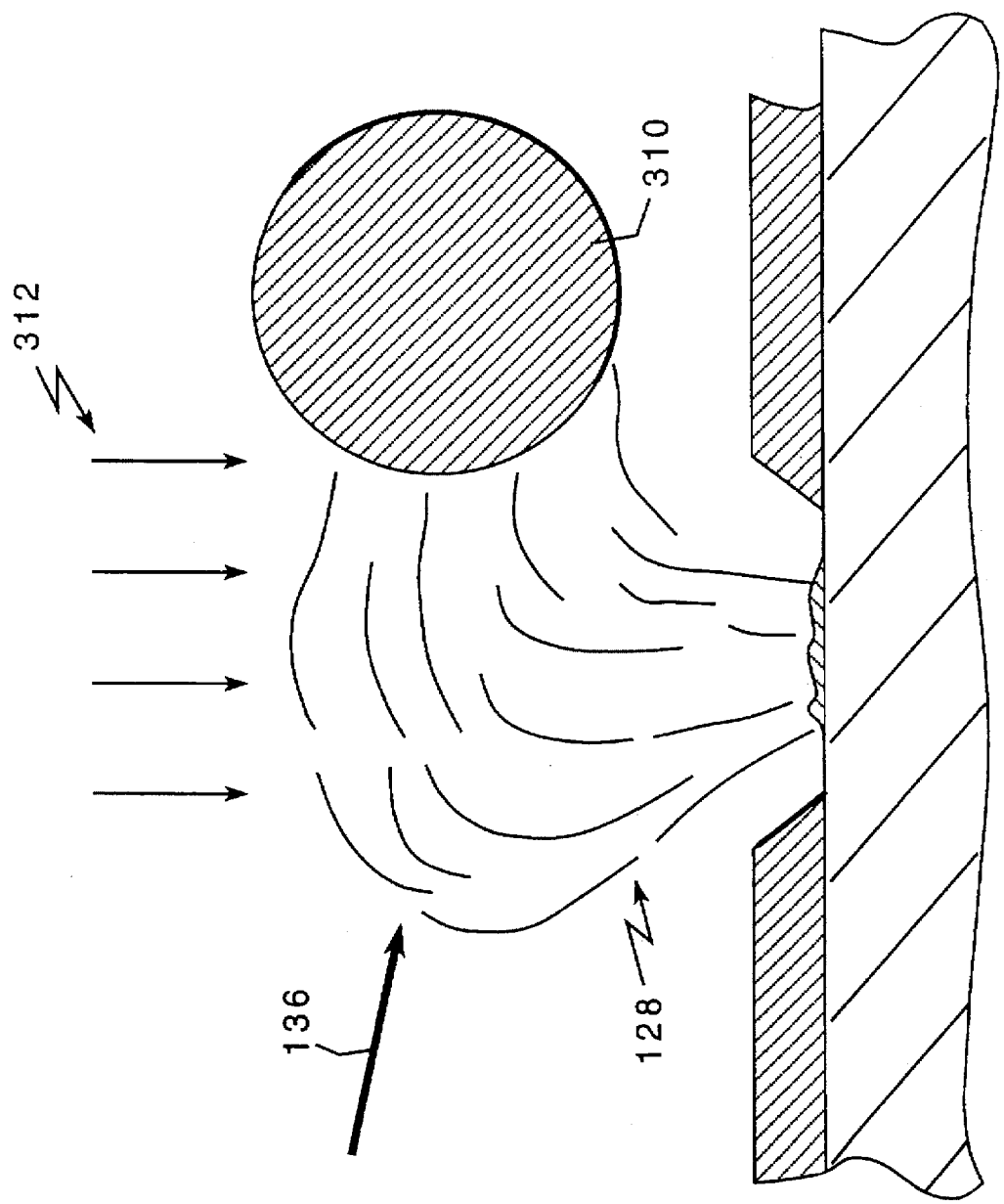
FIG. 14 is schematic side view of a cleaning scheme.

To improve the efficiency of the photoreactive cleaning process, a catalytic surface 310 (e.g., a platinum wire) may be positioned in the vicinity of the cloud of ablation components 128, as shown in FIG. 14. The catalytic surface can take the form of a wire, mesh, porous surface or other configuration, or can be part of the gas delivery nozzle.

Cleaning Chamber

Structure

Figure 15:
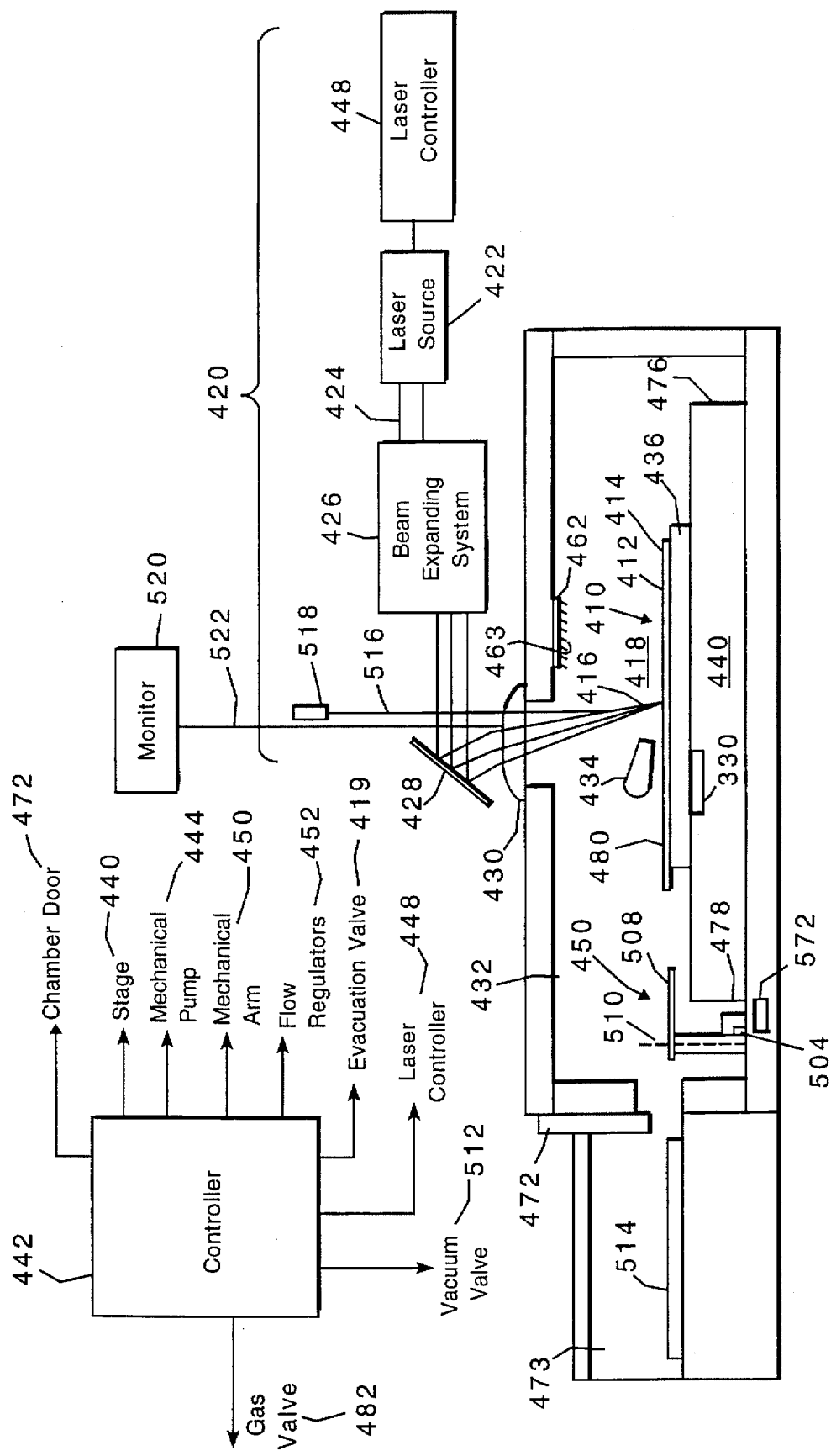
FIG. 15 is a schematic side view of a surface cleaning station.
Figure 16:
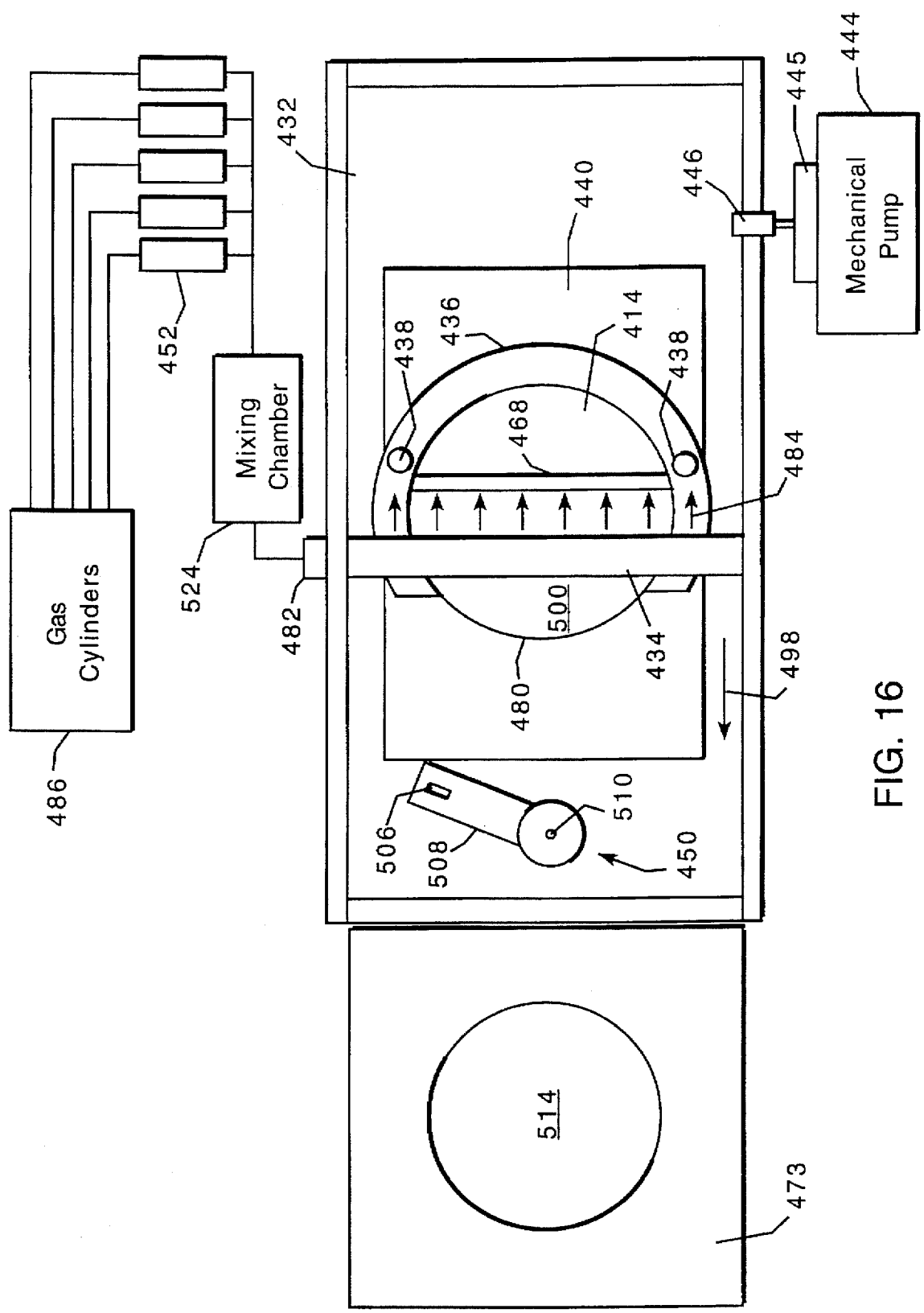
FIG. 16 is a schematic top view of a surface cleaning station.

In one possible cleaning scheme, FIGS. 15 and 16, foreign material 410 on a surface 412 of an eight-inch diameter substrate 414 is removed by a UV initiated reactive process in which energy in a knife-edge shaped laser beam 416 is absorbed by the foreign material. The foreign material undergoes a UV light-initiated reaction process in the presence of a controlled atmosphere 418 (e.g, an input gas including a reactive gas species). The gaseous product of the reaction process is then removed leaving no residue. The laser energy is arranged to be insufficient to damage surface 412.

The laser beam is shaped and delivered via an optical system 420 that includes a laser source 422, which delivers a conventional rectangular cross-section beam 424 via a beam expanding system 426, to a cylindrical mirror 428 (which shapes the beam into a knife-shaped cross-section) and a lens 430. The lens 430 is a cylindrical refractive lens made from fused silica which allows visual inspection of the reaction chamber during a photoreactive cleaning procedure, which may be used to monitor the progress of a cleaning procedure as well as for end-point detection.

Alternatively, the chamber may have a flat window, with the converging lens or mirror located outside the chamber. The height of the window above the substrate defines the length of the beam path within the reactive medium, which should be minimized if a highly absorbing gas mixture is used.

The controlled atmosphere of reactive gas is provided within a closed reaction chamber 432, which is sufficiently sealed to hold a pressure of about 1–3000 Torr. A stream of input gas is blown across the region where the laser beam is striking the foreign material by a nozzle 434.

In one configuration, the reaction chamber is fitted on one end with an "intake" gas manifold and on the other with an "exhaust" manifold which creates laminar flow of gas through a very narrow, low profile (and hence low volume) reaction chamber. The main advantage of the gas manifolds is to maintain a constant supply of filtered, fresh gas (gas can be non-reactive, such as nitrogen or argon, or reactive, such as oxygen) through the chamber, keeping the chamber clean (by carrying away debris/contaminants) and under slight positive over-pressure.

The reaction chamber also contains mechanical equipment to support the substrate and move it into and out of the chamber. The substrate is held securely by a conventional substrate chuck 436 which has protruding pins 438 spaced apart by about 120 degrees to hold the substrate in place. The chuck is mounted on a translation stage 440. Translation stage 440 is electrically driven to move the substrate chuck back and forth within the reaction chamber at a controlled rate (e.g., a constant rate of about 6.5 mm/sec) specified by a controller 442.

For purposes of controlling a surface cleaning sequence, controller 442 is also connected to a mechanical pump 444, an evacuation valve 446, laser controller 448, an electrically driven mechanical arm 450, mass flow regulators 452, vacuum valve 512, gas valve 482, and chamber door 472.

Laser source 422 may be an excimer laser (for example, a Cymer CX-2 excimer laser available from Cymer Laser Technologies of San Diego, Calif., USA), which generates a pulsed beam 424 at wavelengths of 248 nm and 193 nm. Other lasers could be used, e.g., a tunable Alexandrite solid state pulsed laser in combination with a frequency multiplier.

For efficient use of space, the entire optical system (i.e., the laser and the cylindrical mirrors) is mounted on the top of reaction chamber 432. A beam dump 462 (FIG. 15) with a surface that strongly absorbs radiant energy in the range 157–250 nm (e.g., a block of hard-anodized aluminum with a row of narrow vanes 463 oriented in the direction of the reflected laser beam), is mounted inside the reaction chamber to receive radiant energy reflected from the substrate surface during surface cleaning. Lens 430 also serves as a window allowing visual inspection of the inside of the reaction chamber during a photoreactive cleaning procedure.

Referring to FIG. 15, a diagnostic laser beam 516 from a helium-neon laser 518 may be introduced into the reaction chamber through lens 430 with the beam from laser source 422. Monitor 520 could be configured to receive a reflected diagnostic beam 522 to verify that a surface has been cleaned without having to remove the surface from the reaction chamber (e.g., by interferometric or light scattering techniques well-known in the field of surface analysis). Unlike prior diagnostic techniques used to monitor the cleaning of surfaces (e.g., spectrum analyzers used for plasma etching systems), the photoreactive cleaning scheme allows convenient analysis of a surface, in situ, without exposing the surface analyzing equipment to the atmosphere inside the reaction chamber, which might damage the analyzing equipment or might contaminate the reaction chamber.

The mirror 428 and the lens 430 shown in FIG. 15 may be replaced with a flat (non-focussing) window and a cylindrical mirror with a horizontal axis.

As shown in FIG. 16, a mixing chamber 524 is connected between the mass flow meters 452 and the gas valve 482. The mixing chamber comprises a small stainless steel chamber with baffles located in the flow paths of the gases from the mass flow meters 452 to create a turbulent atmosphere inside the mixing chamber which results in a homogenous mixture of the input gases prior to entering the reaction chamber.

Operation

Prior to cleaning, an appropriate set of surface cleaning parameters are selected. As discussed above, the values selected for these parameters will depend on the type of contaminant present, which can be predetermined by Auger analysis, by ESCA (electron scattering chemical analysis), or any other appropriate technique.

Once the contaminants have been identified (and the operating parameters selected) substrate 414 (FIG. 15) is loaded into reaction chamber 432 through door 472 from a wafer carrier and is positioned on substrate chuck 436 against banking pins 438 by mechanical arm 450, with the surface to be cleaned facing upward.

Mechanical pump 444 pumps on the reaction chamber until a pressure of between 1 and 10 Torr is achieved. Then stage 440 translates the chuck 436 and substrate 414 at a constant rate across the reaction chamber from a rear end 476 to a forward end 478. As shown in FIG. 16, as soon as the forward edge 480 of the substrate reaches reaction zone 468, the controller 442 electrically actuates a gas valve 482 to coordinate the delivery of the mixture of input gases (indicated by arrows 484), specified by mass flow regulators 452, from gas cylinders 486, through nozzle 434. When the pressure within the reaction chamber reaches a desired pressure (e.g., between 10 Torr and 1 atmosphere), the controller 442 activates laser source 422 and laser beam pulses 424 are delivered to an illumination zone 468.

Laser beam pulses 424 and input gas 484 in the reaction zone cooperate to cause a photo-activated reaction between the input gas and the foreign material, producing reaction products 496 that are removed from the reaction chamber by a mechanical pump 444 via evacuation valve 446 and through a charcoal filter 445 (see FIG. 16). The mixture of input gases 484 is delivered in a direction opposite the direction of substrate translation (indicated by arrow 498) in order to preferentially propel reaction products 496 away from the forward end 500 of the substrate, which has been cleaned.

After the entire surface of the substrate has passed beneath the illumination zone 468, and depending on the kind of processing the substrate was subjected to prior to being cleaned in reaction chamber 432 and the type of post-processing the substrate is to undergo, the surface 412 of the substrate may be cleaned as many times as is required and under different reaction conditions using different input gases before removing the substrate from the reaction chamber. For example, a surface oxide cleaning procedure may be needed after a surface cleaning targeted to removing organic molecules, because during the organic cleaning sequence, metals may have become oxidized.

Once the surface of substrate 414 has been cleaned, the gas valve 482 is closed. Then the substrate may be another wafer removed from the reaction chamber and loaded into a carrier, by mechanical arm assembly 450 (e.g., a class 1 robotic substrate handler available from ADE Corporation of Newton, Mass., USA) which is coupled to vacuum line 504 and has a slot 506 on arm 508. The mechanical arm assembly 450 is electrically controlled and is capable of rotating about axis 510. Arm 508 can be controllably extended or retracted horizontally (i.e., in the plane of FIG. 15).

The reaction chamber 432 is purged in a conventional manner with nitrogen gas from cylinders 486 until the chamber reaches a pressure of slightly greater than 1 atmosphere, at which point controller 442 opens door 472. Controller 442 then directs the translation stage to position the substrate chuck at the forward end 478 of the reaction chamber and causes the mechanical arm assembly 450 to rotate about axis 510, and arm 508 to extend toward substrate 414, so that slot 506 lies completely under the substrate. The controller opens the vacuum valve 512 between slot 506 and vacuum line 504, thereby causing substrate 414 to be held by arm 508.

Mechanical arm assembly 450, with substrate 414 affixed to arm 508 at slot 506, rotates about axis 510 approximately 180 degrees. Arm 508 extends toward substrate holder 514, until the substrate is centered over holder 514. Controller 442 closes the valve between vacuum line 504 and slot 506 so that the substrate is released from arm 508 and may be held by substrate holder 514.

Arm 450 retracts and rotates from between the reaction chamber and the wafer carrier, and controller 442 closes door 472 of the reaction chamber.

Other Applications

Ion-Implanted Photoresist

Ion implantation is frequently used to fabricate semiconductor devices. A patterned layer of photoresist (approximately 1 µm thick) on a wafer surface shields selected areas of the wafer. The unshielded portions of the wafer surface are bombarded by a stream of ions which become embedded in the wafer, while the photoresist prevents the ions from reaching the shielded regions of the surface. Commonly used ion implantation species include boron, phosphorus and arsenic, at doses up to $10^{16}$ ions per square centimeter.

The removal of patterned ion-implanted photoresist on a substrate presents a number of challenges. The ion bombardment converts the outer surface of photoresist to a hard, brittle shell. It is important to supply laser pulses of sufficiently high energy density (e.g., above 200 mJ/cm$^2$) to break up this layer into small fragments which are more easily oxidized. At the same time, it is important to provide a sufficiently high velocity and concentration of oxygen across the surface (e.g., greater than 10 cm/sec) to increase the number of small particles that are completely consumed by combustion in the oxygen stream and to reduce the number of particles that resettle on the substrate. Under these conditions, a typical 1 µm layer of patterned ion-implanted photoresist can be stripped in 2 to 4 passes with a substrate translation rate of 4 mm/sec.

Another problem encountered with patterned ion-implanted photoresist is the removal of the hardened edges of patterned photoresist features, which strongly adhere to the wafer surface and are not readily removed. An angled beam, incident at an angle of 75° to 82° from normal incidence, with an energy density of up to 2000 mJ/cm$^2$, measured normal to the direction of beam propagation, has been found to efficiently strip such hardened edges without causing visible damage to the substrate. With scan speeds of 4–8 mm/sec, such edge flakes can be removed in 1 to 3 passes.

It has been observed that after successful removal of the top of the hard shell, the uncompacted material underneath, and the edge flakes a thin layer of residual material still remains on the substrate surface (presumably in the form of amorphous carbon). This material is not readily removed by application of additional laser pulses in a reactive gaseous atmosphere such as oxygen. However, it has been observed that applying pulses to a wafer immersed in a liquid is effective in removing this residue. Deionized water, at a temperature between 150° F. and 200° F., and an oxidizing solution (for example, a 0.3% concentration of hydrogen peroxide in deionized water), in the same temperature range, have been used successfully for this application; much lower beam intensities, e.g., 10 to 20 mJ/cm$^2$, can be used when the wafer is immersed in either of these liquids.

Compact Disk Manufacturing

The manufacture of commercial compact disks (e.g., for music recordings or read-only computer memories) involves the fabrication of several intermediate disks. The pattern is initially formed by photolithography on a "master" disk. A "father" disk is formed by peeling an electroplated nickel structure from the "master". A "mother" is generated from the "father" by electroforming, and "stampers" are in turn electroformed from the "mother". The "stampers" then press the desired pattern into the plastic disks.

There are surface cleaning requirements at several stages in this process. The peeling of the "father" leaves a combination of nickel and organic residues on the "master", which must be cleaned if the glass is to be reused. On the "father" disk, the patterned photoresist must be removed from the nickel surface. This photoresist is less than 200 nm thick. Oxygen-assisted laser surface cleaning at relatively low energy (e.g., 285 mJ/cm$^2$) was found to be effective at stripping this photoresist at a practical rate, without leaving any residue. At this energy level, the wafer was cleaned in four passes at a substrate velocity of greater than 10 mm/sec. An oxygen flow velocity of greater than 10 cm/sec across the disk surface was found to be effective. The "stampers" are known to accumulate a residue of the polycarbonate disk material after stamping a large number of disks. When this residue becomes thick enough in places to affect the fidelity of pattern transfer to the disks, the stamper must either be cleaned or discarded. The requirements for cleaning this material from the stamper surface are not as stringent as they are for cleaning semiconductor wafers, since it is only the mechanical properties of the stamper that are relevant. Good results were achieved in stripping polycarbonate residue from a stamper using excimer laser light at a wavelength of 248 nm and an energy between 600 mJ/cm$^2$ and 1200 mJ/cm$^2$ and flowing oxygen across the stamper surface at the beam position at a velocity in excess of 10 cm/sec. With the laser pulsing at a rate of 200 Hz, two passes at a scan speed of 4 mm/sec were sufficient to remove visible residue.

Ink Dot Removal

It is common for semiconductor wafers to undergo a limited form of functional testing before being diced (cut up) into individual chips. It is also a common practice to mark defective devices with a small dot of ink, 1 to 3 mm in diameter, to identify them after dicing. Occasionally, the functional testing must be redone, and in such a case it is necessary to remove the ink dots placed on the wafer by the previous test. Since the wafer is at the end of the fabrication process, the exposed surface typically consists of a thick insulating layer such as BPSG (boro-phosphosilicate glass), and bonding pads of aluminum or an aluminum alloy. It is critical that the method used to remove the ink dots must not damage the bond pads or undercut the insulating layer.

Excellent results have been obtained in removing ink dots from fully processed silicon wafers using an excimer laser beam of 248 nm wavelength and intensity 400 mJ/cm$^2$. With the laser pulsing at a rate of 200 Hz, the dots are cleared in 1 to 3 passes at 2 to 4 mm/sec scan rate, with a flow of oxygen at atmospheric pressure and a velocity near the wafer surface of greater than 10 cm/sec, directed opposite the direction of wafer motion. Examination of the wafers has shown that the bond pads and insulating layers are not damaged by this removal process.

Flat Panel Display Substrates

Figure 17:
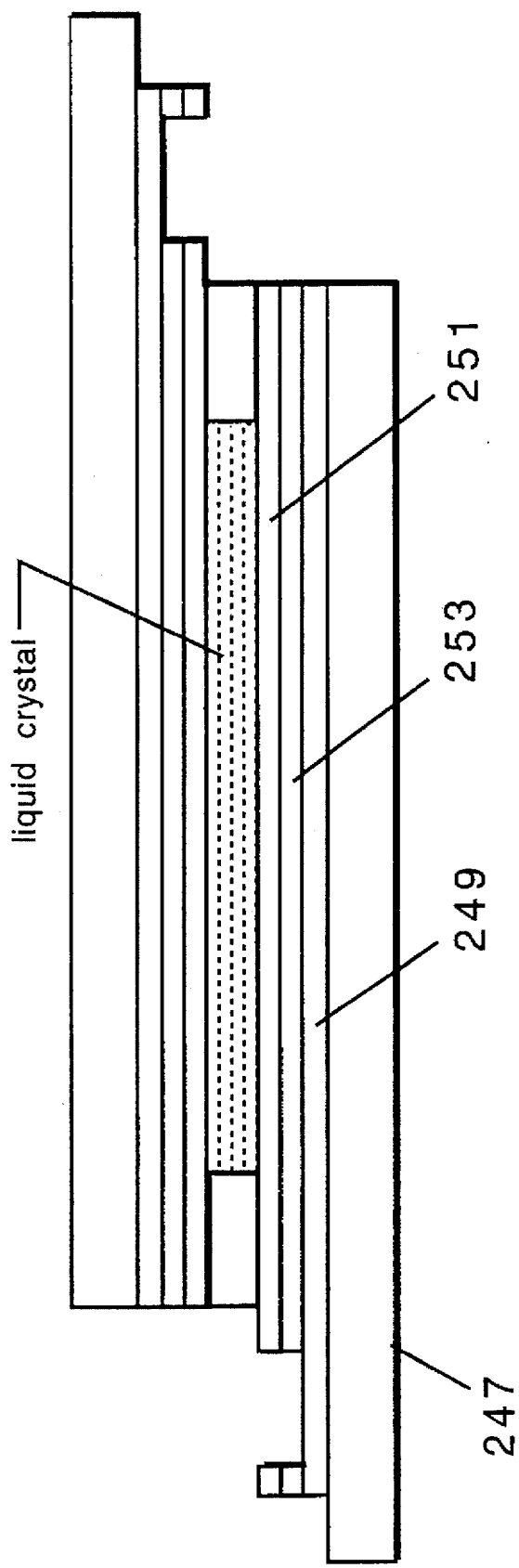
FIG. 17 is a schematic side view of a flat panel display device.

Referring to FIG. 17, the fabrication of flat panel displays involves the deposition and patterning of several device layers (e.g., an indium tin oxide layer 249 which serves as a transparent conductor) on a glass substrate 247. There are several critical cleaning steps which are associated with this fabrication process, in which the same strategy for removing particles and contaminants that was described previously for semiconductor wafers would be effective. In addition, some processes use a thin (e.g., 50 nm) layer of hard-baked polyimide 251, on a spun-on glass layer 253. There is a need for polyimide removal, both for possible rework and for the patterning of this layer. In either case, the cleaning process that would be used for this application would be very similar to that used for stripping photoresist from CD master disks. Using 248 nm wavelength excimer laser radiation, a beam of 250–400 mJ/cm2. would be swept across the surface at a scan rate of 4 to 10 mm/sec, along with a flow of oxygen across the surface of greater than 10 cm/sec, directed opposite the direction of substrate motion.

It is desirable in some cases to remove the polyimide, and other organic or inorganic device layers (for example, the Indium Tin Oxide layer, or a planarization layer) only in selected areas of the substrate. Selective removal has been demonstrated using the process parameters listed in the previous paragraph, with a metal stencil mask overlaying the substrate so that the polyimide is only removed in areas where openings in the mask allow the laser beam to pass through. Features as small as 120 microns in size were formed in this way, with an edge definition of approximately 5 microns.

In cases where selective removal may be desired, but a stencil mask is impractical (because the pattern contains isolated opaque areas, or because the substrates are being moved sequentially under the beam on a conveyor), other methods can be used to obtain selective removal. For example, one or more shadow masks can be placed in the beam path, each of which contains a one-dimensional pattern to be scanned over a portion of the substrate. Each shadow mask can be moved in and out of the beam path as needed, in coordination with the position of the substrate. This method is advantageous in that it does not require placing a stencil mask in close contact with the substrate.

Thin Film Heads

In cleaning the surfaces of thin film heads (e.g., as used in computer hard drives), it is particularly important to effectively clean such surfaces without damage.

Typically, several microns of photoresist that has been hardened by ion milling used in the fabrication of thin film heads must be removed. In one current cleaning scheme, thin film heads are cleaned manually by hand swabbing solvents (using a cotton swab) over the surfaces of the heads. This technique results in a substantial yield loss because the manual force applied during cleaning tends to damage the transducers on the surfaces of the heads. In a second cleaning scheme, the thin film heads are mechanically polished. However, polishing tends to leave behind organic residues on the surface and tends to cause defects in the surface of the head. Both of these techniques are relatively ineffective and may result in an overall yield loss that exceeds 40%. In addition, because these techniques are relatively time-consuming, throughput tends to be low.

Good results have been obtained on thin film head substrates, where approximately 20 microns of photoresist was removed from an aluminum oxide substrate with regions of permalloy (80% Ni and 20% Fe). The photoresist had been used for pattern transfer to the permalloy by ion milling. A beam at 248 nm wavelength, with an energy density of 1000 mJ/cm$^2$ and a scan speed of 4 mm/sec was able to clear this photoresist layer in 5 passes. During the laser scanning, a flow of oxygen was directed across the surface at a velocity greater than 10 cm/sec.

In thin film head fabrication, a thick layer of photoresist must be removed without damaging the underlying patterned layer. Since the patterned layer is only subjected to the beam after the photoresist has been cleared in some areas, a two-step cleaning process would be the most efficient. In the first step, a high energy beam is used to remove most (e.g., 80%), but not all, of the photoresist layer. In the second step, the remaining photoresist layer is removed using a reduced beam energy that would not damage the underlying patterned layer.

Pellicles and Thin Films

Inducer gases, acting to control the rate of a surface cleaning process, play an important role in cleaning delicate surfaces or membranes that have low damage thresholds. For example, a pellicle, which includes a thin polymer membrane that is transparent to the light used to expose substrates in photolithography, stretched above a mask or reticle in a wafer stepper to keep dust and other debris from falling on the optical equipment and causing a defect to be produced in photoresist film, is very difficult to clean by conventional techniques because the tight thickness and uniformity tolerances required preclude any damage to the surface of the pellicle. A high speed, low energy photoreactive surface clean that may be suitable to clean a pellicle surface without damage would comprise, laser pulses with a wavelength of 248 nm and an energy density of about 250 mJ/cm$^2$, and a stage translation rate of about 8 mm/sec. An inducer gas of nitrogen, helium or argon would be added to a reactant gas species of oxygen to suppress the formation of excited oxygen species and thus slow down the oxidation process and minimize the damage to the pellicle surface.

Figure 18:
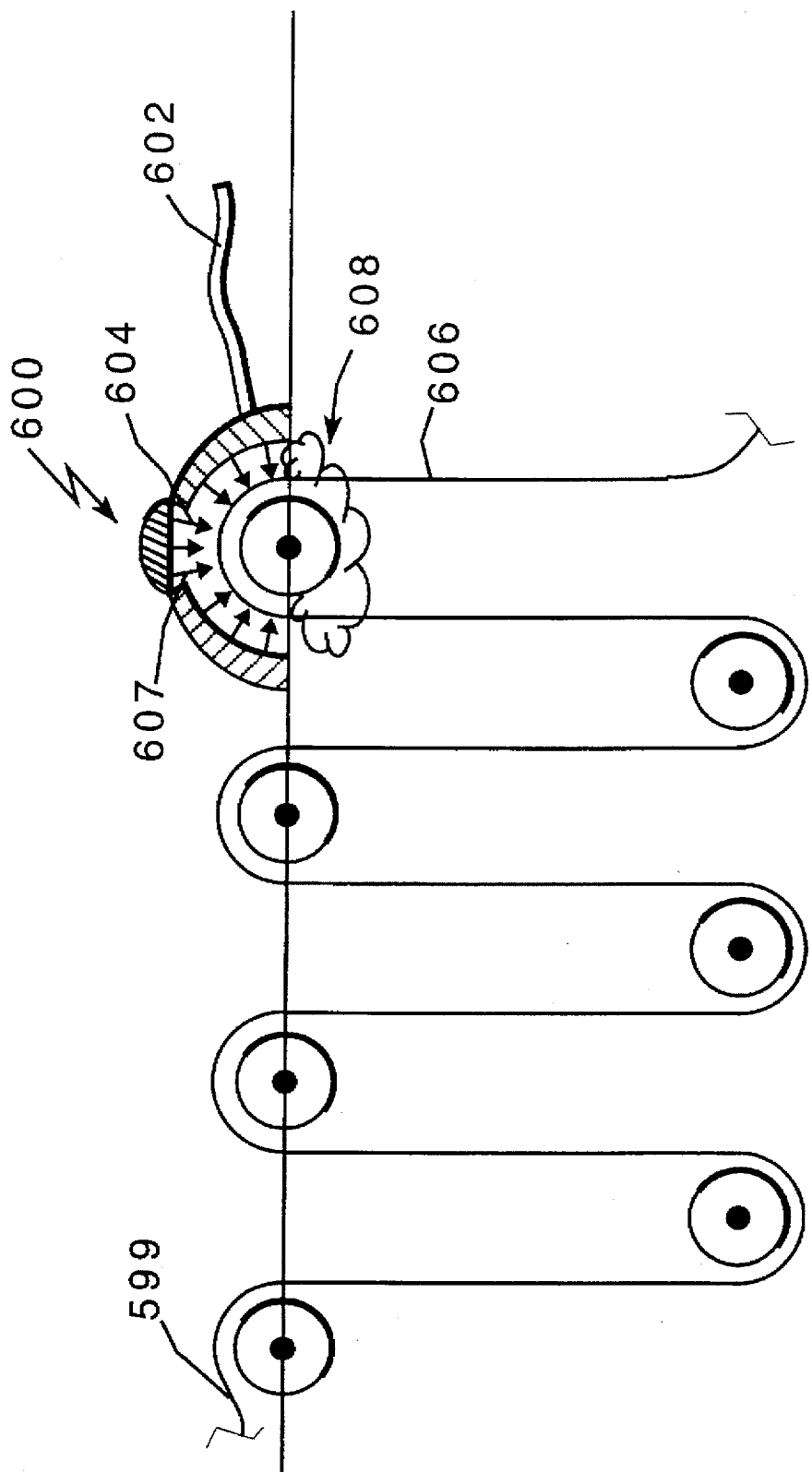
FIG. 18 is a schematic side view of an alternative surface cleaning station.

Other thin films, e.g., magnetic tape 599, can be cleaned in a similar manner. Referring to FIG. 18, an optical head 600 is mounted onto existing manufacturing lines where web processing is employed. An optical fiber 602 delivers laser radiation 604 to the surface of magnetic tape 606. An input gas 607 (e.g., oxygen) is injected into the optical head, while nitrogen gas 608 is used to retain the input gas within the volume of the optical head. The magnetic film moves under the area of laser radiation, without having to be contained within a gas-tight mechanical enclosure.

Medical Instruments

Photoreactive surface cleaning has an important application in the surface treatment of medical instruments prior to their use in surgery. The use of UV light and reactive species contained in a gas or liquid medium may be used to remove bacteria and other contaminants that could cause problems in a medical environment from instruments too delicate or otherwise incompatible with conventional autoclave systems. For example, small plastic optical fibers used for non-invasive surgery are easily damaged by the high energy or high temperature cleaning procedures used in hospitals today (e.g., plasma and high temperature chemical treatment). A suitable photoreactive surface cleaning would comprise laser energy at a wavelength of 248 nm and an energy density of 250 mJ/cm$^2$, a substrate translation rate of 10 mm/sec, oxygen gas, and an inducer gas (e.g., $NH_3$, $H_2$, $N_2O$ and $C_xF_y$).

Alternative Embodiments

Other embodiments are within the scope of the claims.

In an alternative embodiment, the photoreactive cleaning assembly is constructed and arranged so that the substrate is positioned with the surface to be cleaned facing downward or vertically so that the cloud of ablated foreign material and any particles that may have been created move under the action of gravity away from the cleaned substrate surface. It is expected that this arrangement would substantially reduce problems associated with redeposit.

In another embodiment the surface to be cleaned can be a long continuous surface. For example, something pulled through the cleaning chamber in the shape of a film, wire, strip or tape which may or may not be cut into individual pieces after cleaning, or a series of tile like pieces which are either pushed through the process chamber or transported through it on a conveyor like apparatus. The cleaning process lends itself well to this approach if the laser beam is kept in a fixed position and there is some type of seal surrounding the chamber entry and exit points so that the media carrying the reactive species cannot spill out of the chamber and so that air is not sucked into the chamber.

Figure 19:
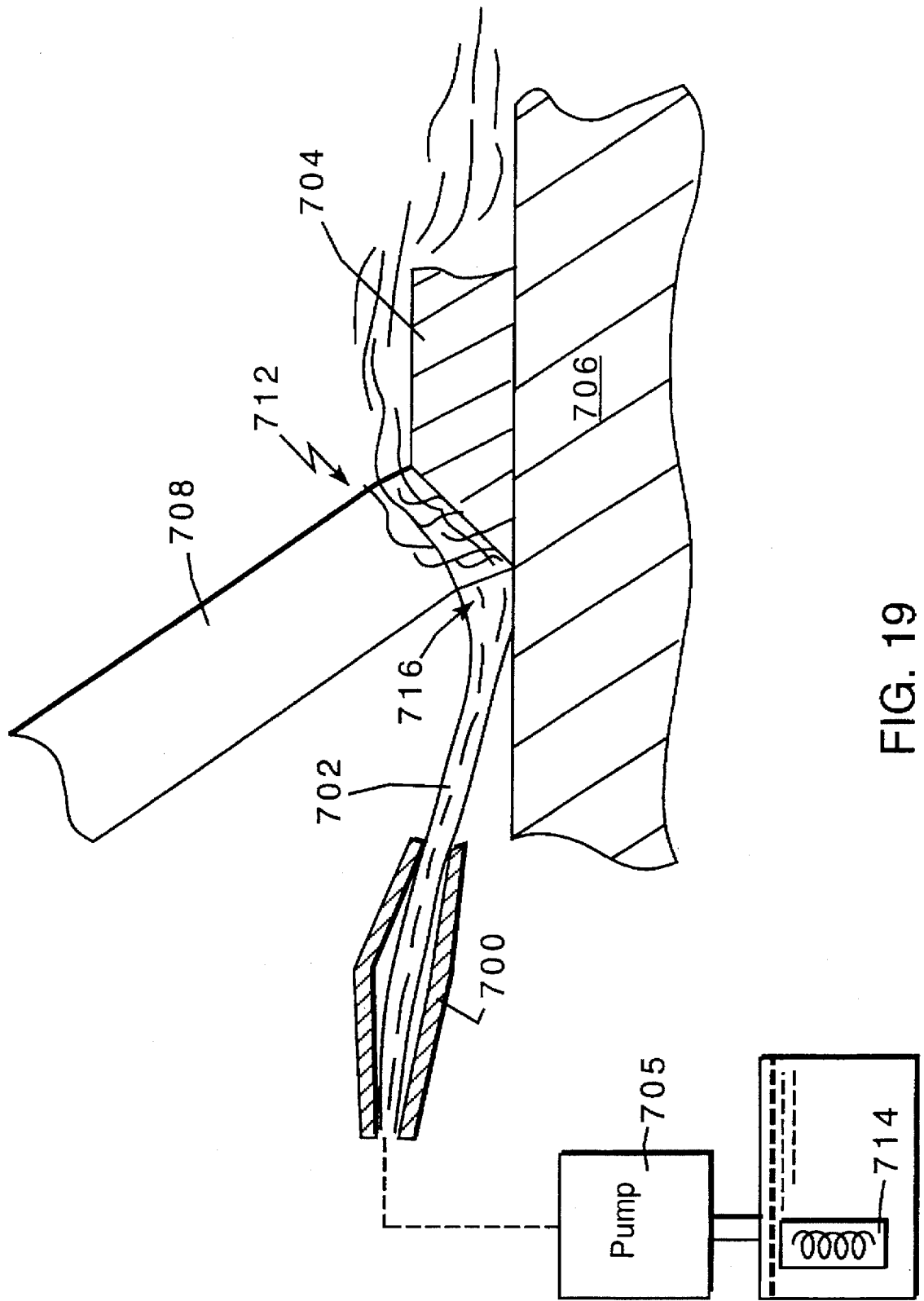
FIG. 19 is a schematic side view of an alternative surface cleaning scheme.

In another embodiment, shown in FIG. 19, the reaction chamber is equipped with a liquid nozzle 700 attached to a pump 705 for applying liquid reactants 702 to foreign material 704 on the surface of a substrate 706. In this way, wet chemistry can be used to enhance the cleaning result achieved by laser pulses 708. The liquid reactants may react directly with foreign material 704 or may react with the ablation components in cloud 712. Wet chemistry alone may be applied to the substrate to effect cleaning in a manner that allows for the efficient utilization of liquid cleaning agents. The liquid can be controllably heated by a heating element 714 so that heated liquid or heated vapor can also be applied to the substrate surface. For example, a jet or flow of liquid will permit a very thin liquid layer 716 to be controllably maintained on the surface during laser scanning. This is beneficial in the case of a liquid reactant species such as hydrogen peroxide, in which the chemical activity is stimulated by the laser light. The greatest possible concentration of excited species in the region where the beam hits the surface can be produced by using a thin liquid layer.

Conclusion

A variety of techniques associated with surface cleaning have been discussed. The selection of which techniques to combine for a given cleaning application, and the parameters to use for each of the techniques depends on the surface, the contaminants, the processing environment, and a variety of other factors and can be determined empirically.

What is claimed is:

1. A method of cleaning a substrate surface, the cleaning being done photoreactively without damaging the surface, comprising delivering a laser beam of UV radiation at an acute angle to the surface, the beam striking the surface at a long and narrow reaction region, said beam delivering 500 to 2.000 mJ/cm$^2$ energy density measured normal to said surface when said beam is incident on said surface at an angle of 80° with respect to normal;

moving the beam and the substrate relative to one another to cause the beam to sweep the surface; and while the beam is sweeping the surface, providing a directed flow of a reactant gas or gas mixture at the reaction region so that the gas is excited by the UV laser beam and chemically interacts with foreign material on said substrate surface, the acute angle of the beam being of a value such that foreign material is removed form the substrate surface.

2. The method of claim 1 wherein the laser beam is directed to the substrate at an angle between 12° and 15° with respect to the surface.

3. The method of claim 1 wherein the directed flow is in a direction that is at an angle smaller that 90° with respect to the surface.

4. The method of claim 1 wherein the directed flow is in a direction that is at an angle between 10° and 45° with respect to the surface.

5. The method of claim 1 wherein the directed flow is at a velocity between 50 mm/sec and 20,000 mm/sec.

6. The method of claim 1 wherein the directed flow is at a velocity between 100 mm/sec and 10,000 mm/sec.

7. The method of claim 1 wherein the directed flow is at a velocity between 200 mm/sec and 5,000 mm/sec.

8. The method of claim 1 wherein the reactant gas or gas mixture includes one or more members of a group of oxidants consisting of oxygen, chlorine, fluorine, and molecules containing oxygen, chlorine, or fluorine.

9. The method of claim 1 wherein the reactant gas or gas mixture includes an inducer gas which accelerates a reaction between the reactant gas or gas mixture and the foreign material.

10. The method of claim 1 further comprising using an optical system that includes only reflective elements along a beam path between a laser source and the substrate surface.

11. The method of claim 1 further comprising maintaining a temperature at the reaction region at between 150° and 200° C.

12. A photoreactive method of removing foreign material from a surface of a substrate to form a reaction product comprising the steps of:

providing a flow of a gaseous reactant in a reaction zone in the vicinity of said foreign material; and delivering a beam of UV radiation at an acute angle to said substrate surface, said beam having an energy level sufficient to interact with said gaseous reactant in said reaction zone and having a long and narrow cross-sectional shape in said reaction zone in the vicinity of said foreign material;

said beam of radiation and said gaseous reactant interacting in the reaction zone to aid said gaseous reactant to chemically interact with and remove said foreign material from said substrate surface and convert said foreign material to said reaction product.

13. The method of claim 12 further comprising providing a directed flow of a sequence of fluids including a gaseous reactant preceded or followed by a fluid including a liquid reactant.

14. The method of claim 12 wherein said acute angle is between 0 and 30 degrees.

15. The method of claim 12 and further including the step of elevating temperature of said surface prior to delivering said beam.

16. The method of claim 12 wherein said substrate comprises a semiconductor wafer with ion-implanted patterned photoresist, said method further comprising the steps of scanning said beam across said surface until a top portion of the ion-implanted photoresist is removed;

wetting the ion-implanted photoresist with a liquid comprising a liquid reactant; and applying laser energy to the ion-implanted photoresist through said liquid.

* * * * *